(12) United States Patent
Ohtsuka

(10) Patent No.: US 8,762,910 B2
(45) Date of Patent: Jun. 24, 2014

(54) WIRING DESIGN METHOD

(75) Inventor: Ikuo Ohtsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 646 days.

(21) Appl. No.: 12/579,730

(22) Filed: Oct. 15, 2009

(65) Prior Publication Data

US 2010/0100862 A1    Apr. 22, 2010

(30) Foreign Application Priority Data

Oct. 17, 2008   (JP) ................. 2008-268489

(51) Int. Cl.
*G06F 17/50*   (2006.01)

(52) U.S. Cl.
USPC ........... 716/110; 716/118; 716/119; 716/124; 716/125; 716/126

(58) Field of Classification Search
CPC ............ G06F 17/5068; G06F 17/5072; G06F 17/5077; G06F 17/5081
USPC ................. 716/104–111, 116–117, 118–119, 716/122–126
See application file for complete search history.

(56) References Cited

U.S. PATENT DOCUMENTS

| | | | |
|---|---|---|---|
| 6,378,121 B2 | 4/2002 | Hiraga | |
| 8,065,652 B1 * | 11/2011 | Salowe et al. | 716/139 |
| 2003/0121018 A1 * | 6/2003 | Leung et al. | 716/12 |
| 2007/0022400 A1 | 1/2007 | Kadota | |
| 2007/0028201 A1 * | 2/2007 | Mehrotra et al. | 716/12 |
| 2008/0184187 A1 * | 7/2008 | Mehrotra et al. | 716/13 |

FOREIGN PATENT DOCUMENTS

| | | |
|---|---|---|
| JP | 63-304375 | 12/1988 |
| JP | 3-180978 | 8/1991 |
| JP | 10-270563 | 10/1998 |
| JP | 63-237544 | 10/1998 |
| JP | 2000-227927 | 8/2000 |
| JP | 2006-294707 | 10/2006 |
| JP | 2007-26170 | 2/2007 |
| WO | WO 00/38228 | 6/2000 |

OTHER PUBLICATIONS

Office Action issued by the Japanese Patent Office on Oct. 2, 2012 in the corresponding Japanese patent application No. 2008-268489.

* cited by examiner

*Primary Examiner* — Paul Dinh

(74) *Attorney, Agent, or Firm* — Staas & Halsey LLP

(57) ABSTRACT

A wiring design method and apparatus are provided. The wiring design method includes dividing a wiring region represented by wiring region data to generate a plurality of first division regions based on a first wiring rule and generating, when a second wiring rule different from the first wiring rule may be set in the first division region, second division regions with the second wiring rule in the first division region.

17 Claims, 29 Drawing Sheets

| SPECIAL RULE REGION ID | WIRING RULE ID | START COORDINATES [mm] | END COORDINATES [mm] | LAYER | COMPONENT ID | THE NUMBER OF EMPTY WIRING TRACKS | | THE NUMBER OF EMPTY GRIDS |
|---|---|---|---|---|---|---|---|---|
| | | | | | | H DIRECTION | V DIRECTION | |
| 0 | 1 | (40, 100) | (80, 140) | 1 | 0 | 0 | 0 | 0 |
| 1 | 1 | (40, 100) | (80, 140) | 2 | 0 | 78 | 78 | 6084 |
| 2 | 1 | (60, 160) | (120, 220) | 1 | nil | nil | nil | nil |
| 3 | 1 | (60, 160) | (120, 220) | 2 | nil | nil | nil | nil |
| 4 | 2 | (140, 60) | (200, 100) | 1 | nil | nil | nil | nil |
| ... | ... | | | | | | | |

FIG. 8

| PIN ID | CENTER COORDINATES [mm] | SHAPE (CIRCLE = 0, RECTANGLE = 1) | LAYER (from, to) | X DIRECTION DIMENSION [μm] | Y DIRECTION DIMENSION [μm] | DISCRETE INFORMATION: NUMERICAL VALUE 1 REPRESENTS DISCRETE (UNWIRED STATE) |
|---|---|---|---|---|---|---|
| 0 | (50, 50) | 0 | (1,6) | 100 | 100 | 0 |
| 1 | (80, 50) | 0 | (1,6) | 100 | 100 | 1 |
| 2 | (90, 100) | 1 | (1,1) | 100 | 110 | 1 |
| 3 | (120, 100) | 1 | (6,6) | 100 | 110 | 0 |
| 4 | (130, 190) | 1 | (1,1) | 100 | 110 | 1 |
| ... | | | | | | |

| WIRING RULE ID | LAYER | WIRING WIDTH[μm] | GAP [μm] | |
|---|---|---|---|---|
| | | | PIN : WIRING | WIRING : WIRING |
| 0 | 1,2,3,4,5 | 100 | 150 | 150 |
| 1 | 2,3,4,5 | 100 | 100 | 100 |
| | 1,6 | 100 | 120 | 100 |
| 2 | 1,2,3,4,5 | 100 | 100 | 100 |
| ... | | | | |

| NET ID | RULE ID | RULE ID OF REGION TO BE PREVENTED FROM BEING PASSED BY WIRING | PIN ID | LINE SEGMENT ID | THE NUMBER OF VIOLATIONS AND UNWIRED LINES |
|---|---|---|---|---|---|
| 0 | 0 | nil | 1, 3 | 0, 1, 2 | 0 |
| 1 | 0 | 1, 2 | 4, 6 | nil | 2 |
| 2 | 2 | nil | 0, 2, 5 | nil | 3 |
| ... | | | | | |

D19

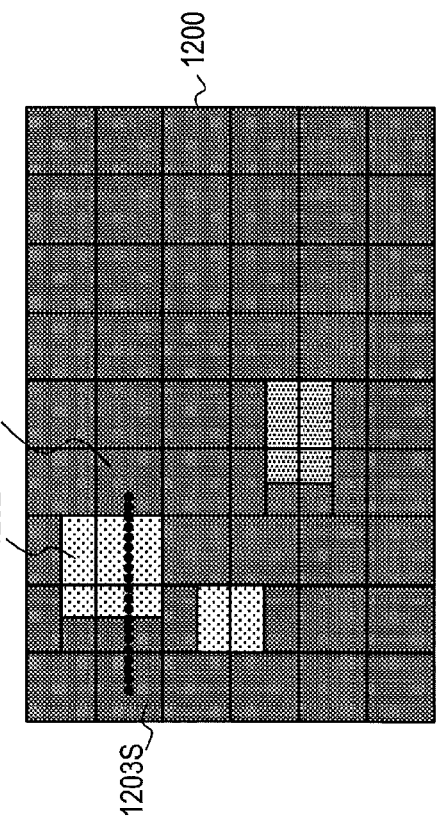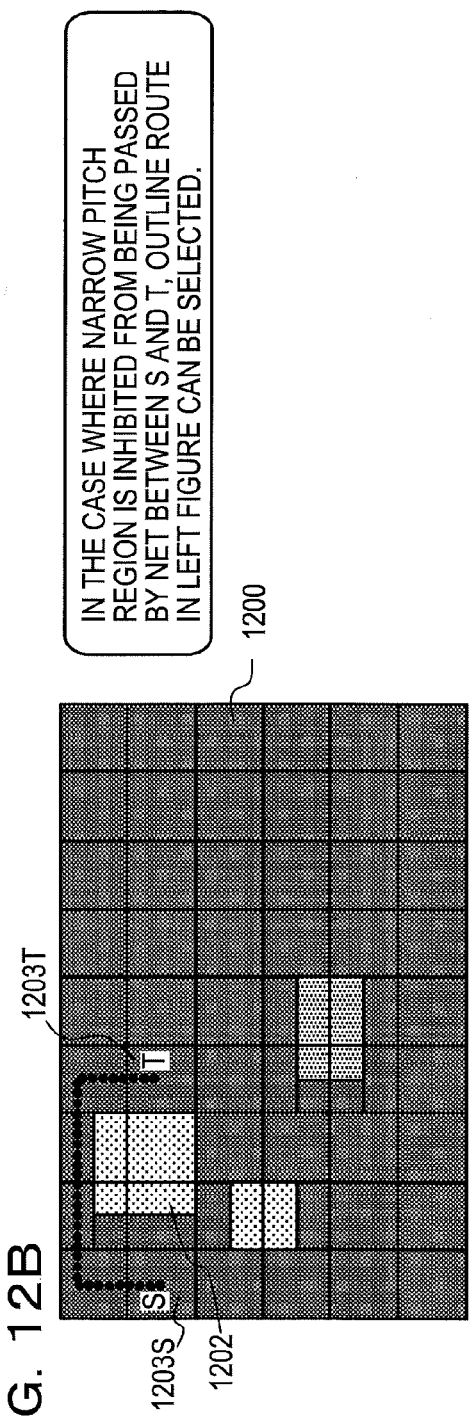
FIG. 12A
FIG. 12B
IN THE CASE WHERE NARROW PITCH REGION IS INHIBITED FROM BEING PASSED BY NET BETWEEN S AND T, OUTLINE ROUTE IN LEFT FIGURE CAN BE SELECTED.

| LINE SEGMENT ID | NET ID | LAYER | START POINT [mm] | END POINT [mm] |
|---|---|---|---|---|
| 0 | 0 | 2 | (80,50) | (100, 50) |
| 1 | 0 | 3 | (100, 50) | (100, 100) |
| 2 | 0 | 2 | (100, 100) | (120, 100) |
| ... | | | | |

| COMPONENT ID | THE NUMBER OF PINS | | INTERVAL BETWEEN PINS [μm] | | PIN SIZE [μm] | |
|---|---|---|---|---|---|---|
| | H DIRECTION | V DIRECTION | H DIRECTION | V DIRECTION | H DIRECTION | V DIRECTION |
| 0 | 40 | 40 | 1000 | 1000 | 500 | 500 |
| ... | | | | | | |

| G-cell ID | START COORDI- NATES [mm] | END COORDI- NATES [mm] | LAYER | SPECIAL RULE REGION ID | THE NUMBER OF WIRING RESOURCES (ESTIMATION) | | THE NUMBER OF RESOURCE GRIDS (ESTIMATION) | THE NUMBER OF CONSUMED RESOURCE GRIDS | LABEL PROPAGA- TION PARENT G-cell ID | LABEL | S/T flag | THE NUMBER OF CONSUMED WIRING RESOURCES | | | |
|---|---|---|---|---|---|---|---|---|---|---|---|---|---|---|---|
| | | | | | H DIRECTION | V DIRECTION | | | | | | EAST SIDE | WEST SIDE | SOUTH SIDE | NORTH SIDE |
| 0 | (0, 0) | (40, 20) | 1 | nil | 0 | 160 | 6400 | 0 | nil | ∞ | nil | 0 | 0 | 0 | 0 |
| 1 | (0, 0) | (40, 20) | 2 | nil | 0 | 160 | 6400 | 0 | nil | ∞ | nil | 0 | 0 | 0 | 0 |
| 2 | (0, 0) | (40, 20) | 3 | nil | 80 | 160 | 12800 | 0 | nil | ∞ | nil | 0 | 0 | 0 | 0 |
| 3 | (0, 0) | (40, 20) | 4 | nil | 80 | 160 | 12800 | 0 | nil | ∞ | nil | 0 | 0 | 0 | 0 |
| 4 | (0, 0) | (40, 20) | 5 | nil | 80 | 160 | 12800 | 0 | nil | ∞ | nil | 0 | 0 | 0 | 0 |
| 5 | (0, 0) | (40, 20) | 6 | nil | 80 | 160 | 12800 | | | ∞ | nil | 0 | 0 | 0 | 0 |
| 6 | (0, 20) | (40, 60) | 1 | nil | 320 | 320 | 102400 | | | | | | | | |
| ... | | | | | | | | | | | | | | | |

| WIRING RULE ID | LAYER | WIRING WIDTH [μm] | GAP [μm] | |
|---|---|---|---|---|
| | | | PIN : WIRING | WIRING : WIRING |
| 0 | 1,2,3,4,5 | 100 | 150 | 150 |
| ... | | | | |

FIG. 16B

| COMPONENT ID | THE NUMBER OF PINS | | INTERVAL BETWEEN PINS [μm] | | PIN SIZE [μm] | |
|---|---|---|---|---|---|---|
| | H DIRECTION | V DIRECTION | H DIRECTION | V DIRECTION | H DIRECTION | V DIRECTION |
| 0 | 40 | 40 | 1000 | 1000 | 500 | 500 |
| ... | | | | | | |

FIG. 16C

| NET ID | WIRING RULE ID | RULE ID OF REGION TO BE PREVENTED FROM BEING PASSED BY WIRING | PIN ID | LINE SEGMENT ID | THE NUMBER OF VIOLATIONS AND UNWIRED PINS |
|---|---|---|---|---|---|
| 0 | 0 | nil | 1,3 | 0,1,2 | 0 |
| ... | | | | | |

FIG. 16D

| WIRING INHIBITION REGION ID | START COORDINATES [mm] | END COORDINATES [mm] | LAYER |
|---|---|---|---|
| 0 | (0, 0) | (20, 20) | 1 |
| ... | | | |

FIG. 16E

| PIN ID | SHAPE (CIRCLE=0, RECTANGLE=1) | CENTER COORDINATES [mm] | LAYER (from, to) | X DIRECTION DIMENSION [μm] | Y DIRECTION DIMENSION [μm] | DISCRETE INFORMATION: NUMERICAL VALUE 1 REPRESENTS DISCRETE (UNWIRED STATE) |
|---|---|---|---|---|---|---|
| 0 | 0 | (50, 50) | (1, 6) | 100 | 100 | 0 |
| ... | | | | | | |

FIG. 16F

| LINE SEGMENT ID | NET ID | LAYER | START POINT [mm] | END POINT [mm] |
|---|---|---|---|---|
| 0 | 0 | 2 | (80, 50) | (100, 50) |
| ... | | | | |

FIG. 16G

| SPECIAL RULE REGION ID | WIRING RULE ID | SPECIAL RULE REGION ID | LAYER | START COORDINATES [mm] | END COORDINATES [mm] | THE NUMBER OF WIRING RESOURCES (ESTIMATION) | | THE NUMBER OF RESOURCE GRIDS (ESTIMATION) | COMPONENT ID |
|---|---|---|---|---|---|---|---|---|---|
| | | | | | | H DIRECTION | V DIRECTION | | |
| 0 | 1 | nil | 1 | (40, 100) | (80, 140) | 0 | 160 | 6400 | 0 |
| ... | | | | | | | | | |

FIG. 16H

| G-cell ID | START COORDINATES [mm] | END COORDINATES [mm] | LAYER | THE NUMBER OF CONSUMED RESOURCE GRIDS | THE NUMBER OF EMPTY WIRING TRACKS | | THE NUMBER OF EMPTY GRIDS | LABEL PROPAGATION PARENT G-cell ID | LABEL | S/T flag | THE NUMBER OF CONSUMED WIRING RESOURCES | | | |
|---|---|---|---|---|---|---|---|---|---|---|---|---|---|---|
| | | | | | H DIRECTION | V DIRECTION | | | | | EAST SIDE | WEST SIDE | SOUTH SIDE | NORTH SIDE |
| 0 | (0, 0) | (40, 20) | 1 | 0 | 0 | 0 | 0 | nil | ∞ | nil | 0 | 0 | 0 | 0 |
| ... | | | | | | | | | | | | | | |

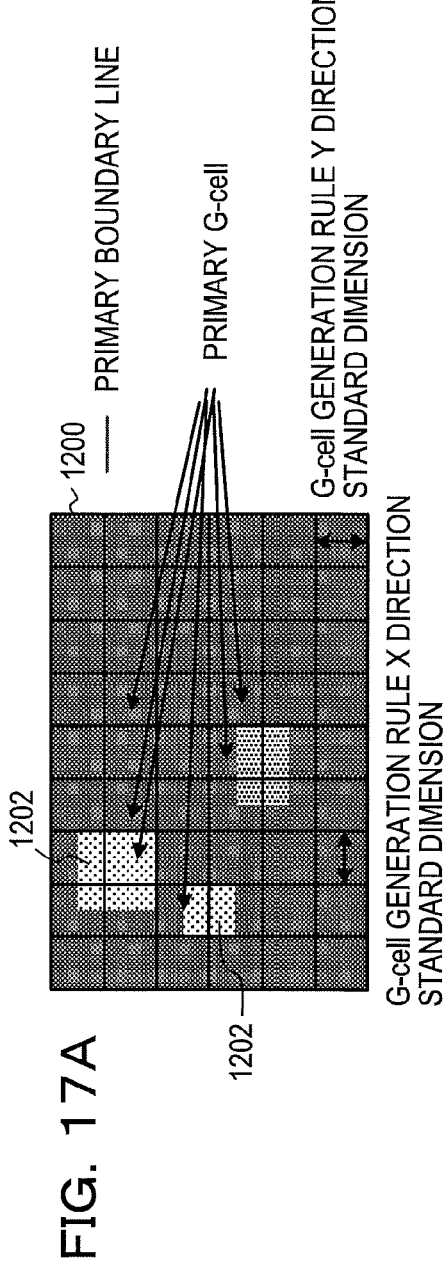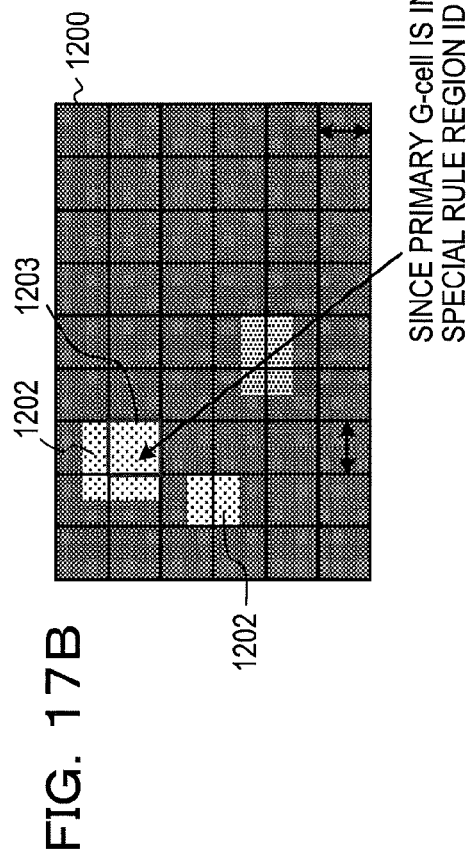
FIG. 17A
FIG. 17B

DIVISION METHOD

MERGE METHOD

FIG. 19A
S11 SELECT ONE UNPROCESSED PRIMARY G-cell

FIG. 19B
S12 EXTRACT VERTEX OF SPECIAL RULE REGION IN PRIMARY G-cell

FIG. 19C
S14 GENERATE VERTICAL AND HORIZONTAL SECONDARY PARTING LINES FROM EXTRACTED VERTEX TO SIDES OF PRIMARY G-cell FIG. 19D
S15 CREATE SECONDARY G-cells FROM SIDES OF PRIMARY G-cell AND SECONDARY PARTING LINES

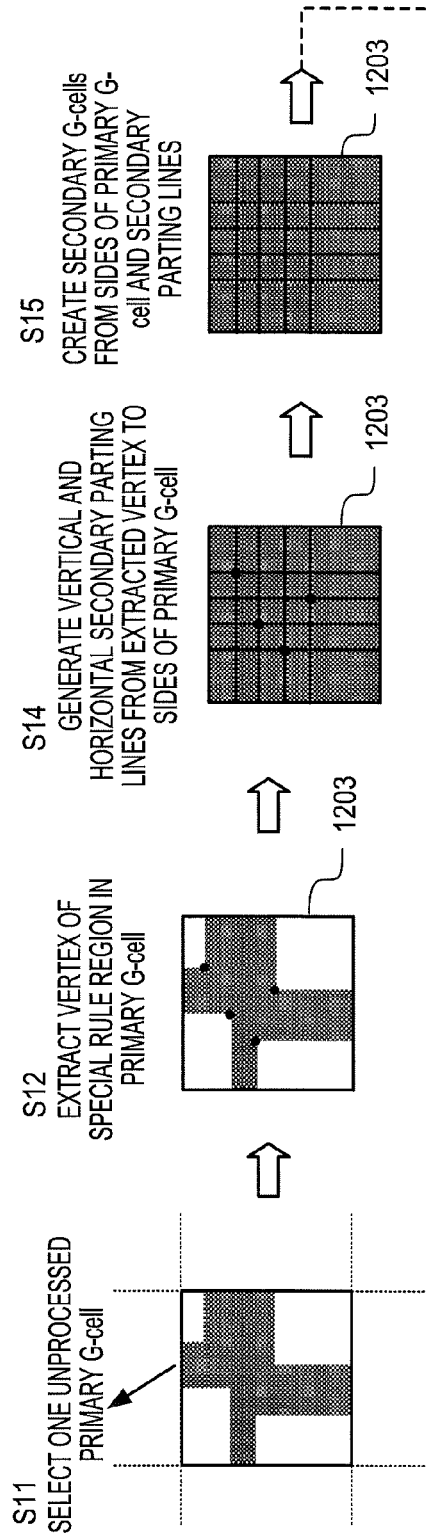

FIG. 19E
S16 COPY SPECIAL RULE REGION ID TO SECONDARY G-cell INCLUDED IN SPECIAL RULE REGION FIG. 19F
S17 MERGE SECONDARY G-cells HAVING SAME SPECIAL RULE REGION ID AND COMMON VERTICAL SIDE (HORIZONTAL DIRECTION MERGE)

FIG. 19G
S18 MERGE SECONDARY G-cells HAVING SAME SPECIAL RULE REGION ID AND COMMON HORIZONTAL SIDE (VERTICAL DIRECTION MERGE)

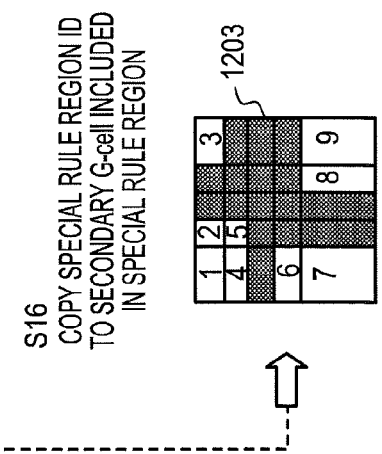
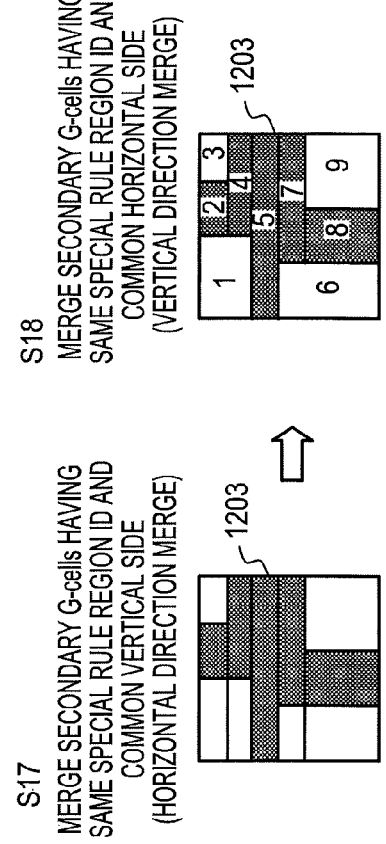
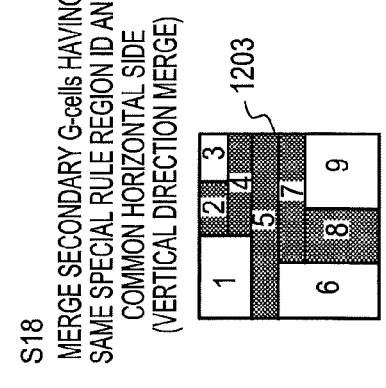

FIG. 25A

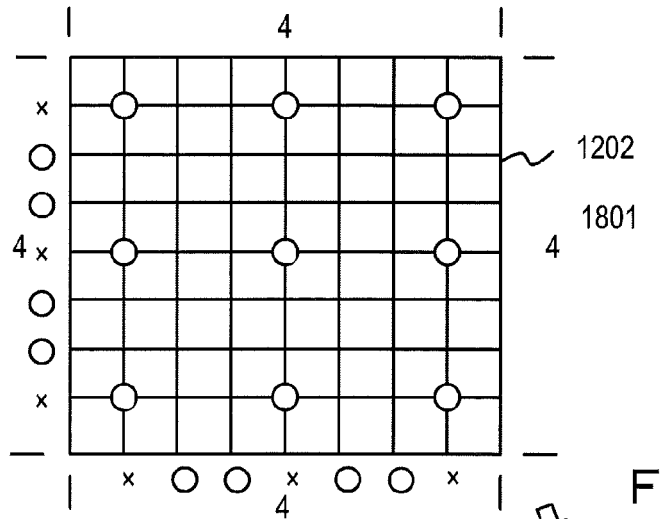

FIG. 25B

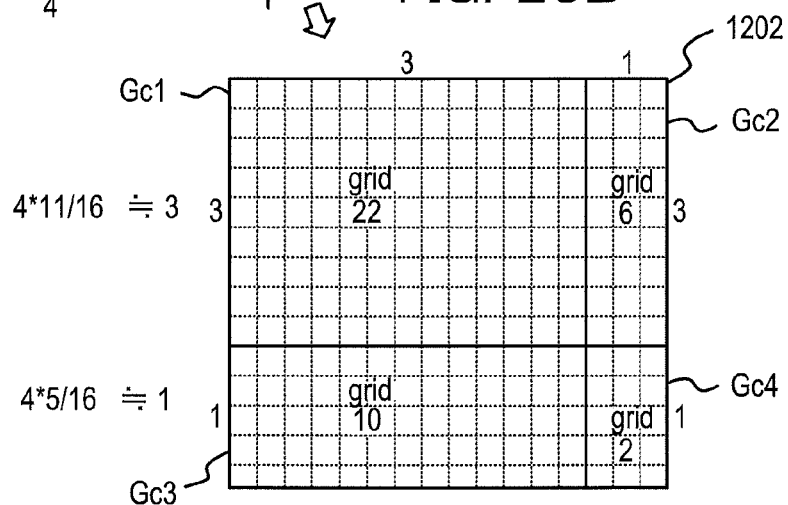

| Gc1 |
| --- |
| THREE GRIDS ARE CONSUMED WHEN ONE WIRING PASSES IN THE H DIRECTION.<br>THREE GRIDS ARE CONSUMED WHEN ONE WIRING PASSES IN THE V DIRECTION.<br>SIX GRIDS ARE CONSUMED WHEN ONE WIRING PASSES FROM THE H DIRECTION TO THE V DIRECTION. |

| Gc2 |
| --- |
| ONE GRID IS CONSUMED WHEN ONE WIRING PASSES IN THE H DIRECTION.<br>THREE GRIDS ARE CONSUMED WHEN ONE WIRING PASSES IN THE V DIRECTION.<br>FOUR GRIDS ARE CONSUMED WHEN ONE WIRING PASSES FROM THE H DIRECTION TO THE V DIRECTION. |

| Gc3 |
| --- |
| THREE GRIDS ARE CONSUMED WHEN ONE WIRING PASSES IN THE H DIRECTION.<br>ONE GRID IS CONSUMED WHEN ONE WIRING PASSES IN THE V DIRECTION.<br>SIX GRIDS ARE CONSUMED WHEN ONE WIRING PASSES FROM THE H DIRECTION TO THE V DIRECTION. |

| Gc4 |
| --- |
| ONE GRID IS CONSUMED WHEN ONE WIRING PASSES IN THE H DIRECTION.<br>ONE GRID IS CONSUMED WHEN ONE WIRING PASSES IN THE V DIRECTION.<br>TWO GRIDS ARE CONSUMED WHEN ONE WIRING PASSES FROM THE H DIRECTION TO THE V DIRECTION. |

MERIT:
◆ UNDERESTIMATION OF WIRING ACCOMMODATION PROPERTY IN HIGH DENSITY PIN ARRANGEMENT PORTION LIKE BGA CAN BE AVOIDED, AND RESOURCE OF G-cell CAN BE PROPERLY ESTIMATED, TO THEREBY ENABLE OPTIMAL GLOBAL ROUTE TO BE SEARCHED.

FIG. 27A

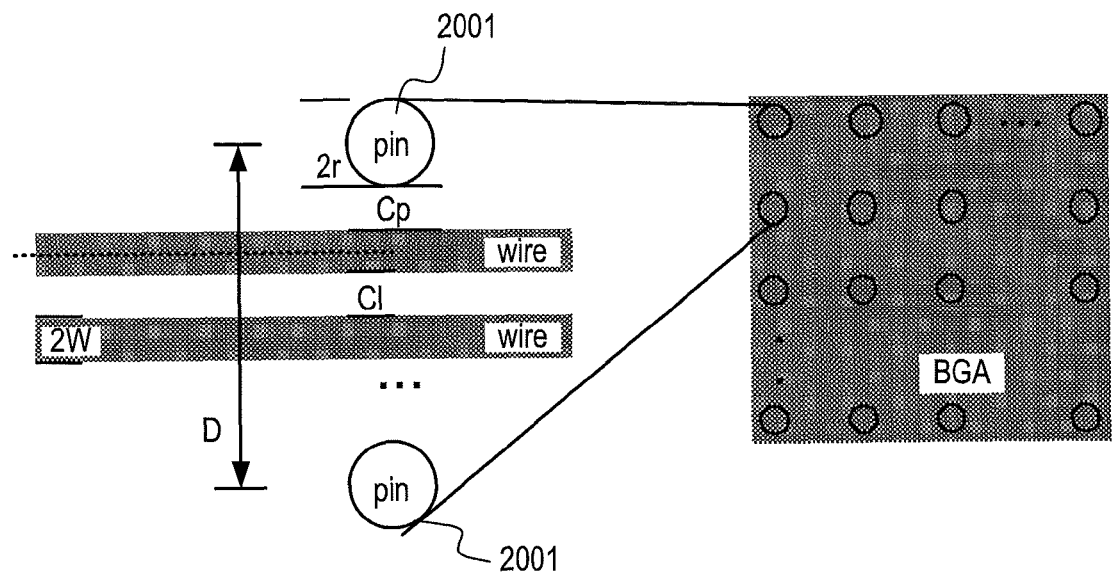

FIG. 27B

WHEN IT IS SET THAT DIMENSION BETWEEN CENTERS OF PINS IS D,
THAT RADIUS OF PIN IS r, THAT CLEARANCE BETWEEN PIN AND WIRING IS Cp,
THAT WIRING WIDTH IS 2w, AND THAT CLEARANCE BETWEEN LINE SEGMENTS IS Cl,
DISTANCE L LEFT FOR WIRING BETWEEN PINS IS GIVEN BY L = D - 2 (r + Cp).
WHEN L >= 2w, AT LEAST ONE WIRING CAN BE ARRANGED.
When (L - 2w) / (2w + Cl) >=1, SECOND AND SUBSEQUENT WIRING CAN BE ARRANGED.
AT MOST THE NUMBER OF WIRINGS GIVEN BY t = 1 + floor ((L - 2w) / (2w + Cl) CAN BE ARRANGED BETWEEN PINS.
THE OBTAINED NUMBER OF WIRINGS IS SET AS THE NUMBER OF TRACKS BETWEEN PINS.
WHEN PIN ARRANGEMENT OF BGA IS GIVEN BY hv, THE NUMBERS OF ESTIMATED TRACKS IN RESPECTIVE DIRECTIONS ARE GIVEN BY Th = t (h - 1), Tv = t (v - 1).
THE NUMBER OF ESTIMATED GRIDS IS GIVEN BY (Th + h) (Tv + v) - hv.

US 8,762,910 B2

WIRING DESIGN METHOD

CROSS-REFERENCE TO RELATED APPLICATIONS

This application is related to and claims priority to Japanese Patent Application No. 2008-268489, filed on Oct. 17, 2008, and incorporated herein by reference.

BACKGROUND

1. Field

The embodiments discussed herein are directed to a wiring design method.

2. Description of the Related Art

Generally, a semiconductor integrated circuit (LSI) and a large-scale printed circuit board are wired by an automatic wiring technique. In recent years, the number of cells including in a semiconductor integrated circuit, and the number of components mounted on a printed circuit board have been significantly increased. Before the automatic wiring of a semiconductor integrated circuit or a large-scale printed circuit board is performed, a wiring region in which wirings are arranged is divided into a plurality of small regions (here, called "G-cells") according to a fixed rule. When the wiring region is divided into G-cells, a wiring route of each net may be set by determining the G-cells passed by a wiring and determining the order in which the G-cells are passed by the wiring.

The amount of wirings which can be accommodated in each G-cell is limited. Therefore, the wiring resource of each G-cell represents the amount of wirings which can be accommodated in each G-cell. The wiring resource is, for example, the number of wirings or the number of grid points. Wiring routes are assigned to each G-cell within a range not to exceed the wiring resource.

The grid point may be defined as a point used as a base unit of wiring. The grid point means an intersection of lines arranged with a predetermined pitch interval in two directions orthogonal to each other. A wiring route is determined as a combination of lines each of which is formed by connecting between the grid points adjacent to each other in parallel with one of the two directions. The number of wirings calculated as the wiring resource is, for example, the number of straight lines (wiring tracks) which are calculated for each of the two directions and which can be assigned as wiring routes to across the entire G-cell.

SUMMARY

It is an aspect of the embodiments discussed herein to provide a wiring design method includes dividing a wiring region represented by wiring region data to generate a plurality of first division regions based on a first wiring rule and generating, when a second wiring rule different from the first wiring rule may be set in the first division region, second division regions with the second wiring rule in the first division region.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF DRAWINGS

FIG. 7 illustrates a data configuration of special rule region information D18;

FIG. 8 illustrates a data configuration of pin information D15;

FIG. 9 illustrates a data configuration of wiring rule information D17;

FIG. 11 illustrates a data configuration of net information D19;

FIGS. 12A and 12B illustrate an example of a wiring route determined by a special rule region existing between two G-cells between which a wiring is to be determined;

FIG. 14 illustrates a data configuration of component information D14;

FIG. 15 illustrates a data configuration of G-cell information D1;

FIGS. 16A-16H illustrate a relationship between the G-cell information D1 and the information D14 to D20;

FIGS. 17A-17B illustrate a generation method of primary cells, and explaining a primary cell to which a single special rule is applied among the primary cells;

FIGS. 19A-19G illustrate merge processing;

FIGS. 25A-25B illustrate a distribution method of a wiring resource of a special rule region 1202 to respective G-cells 1203;

FIGS. 27A-27B illustrate a calculation method of a maximum number of wirings which can be made to pass between obstacles;

DETAILED DESCRIPTION OF THE EMBODIMENTS

In the automatic wiring performed by dividing a wiring region into G-cells, after the G-cells passed by respective wiring routes may be determined, internal wiring routes may be determined for each of the G-cells. Thereby, all wiring routes cannot be determined for a G-cell which does not have enough wiring resource to be able to accommodate the assigned wiring routes. For this reason, it is important to accurately estimate the resource of each of the G-cells.

High density and multi-terminal components (for example, BGA: Ball Grid Array) are mounted on a printed circuit board. As a countermeasure against crosstalk, and the like, wiring rules, that is, a wiring width, a clearance which is an interval margin between a wiring and an object, a minimum interval between wirings or between a wiring and a pin, and the like, may be made different in correspondence with a position in the printed circuit board.

Where a plurality of sub regions, to which different wiring rules are applied, exist in a wiring region, there is generated a G-cell in which a plurality of regions having different wiring rules exist. The wiring resource of the G-cell may be calculated by using the wiring rule applied to the G-cell. The mixed existing different wiring rules complicate the resource management. Thereby, the automatic wiring which is performed by assigning the resources is made complicated.

Figure 1A:
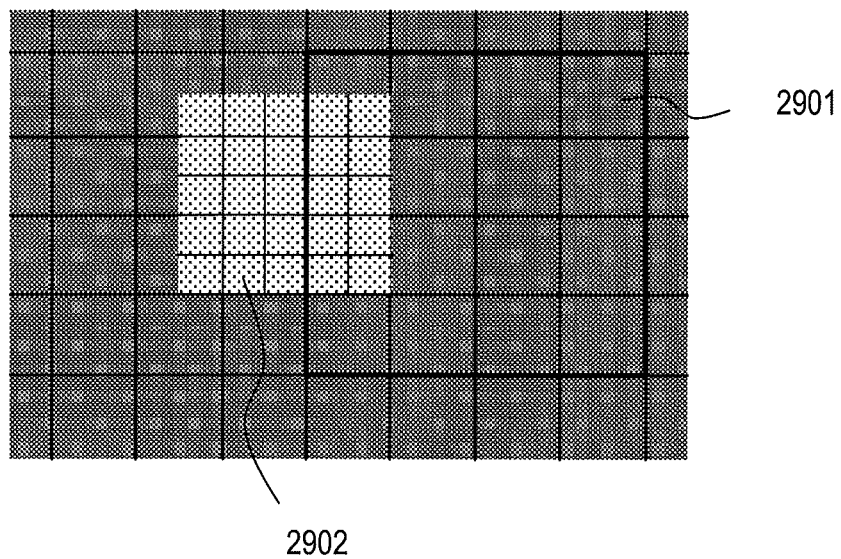
FIG. 1A and FIG. 1B illustrate mixed existing wiring rules in a G-cell.
Figure 1B:
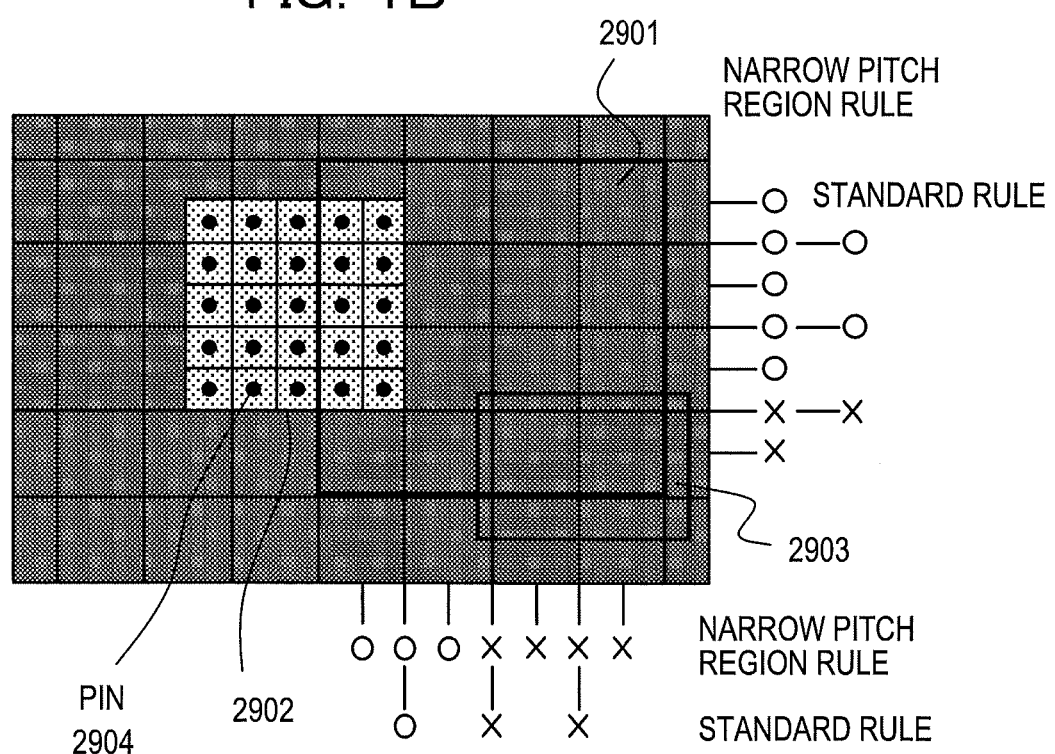

FIG. 1A and FIG. 1B illustrate mixed existing wiring rules in a G-cell. In FIG. 1A, reference numeral 2901 denotes a G-cell, and reference numeral 2902 denotes a sub region whose wiring rule is different from that of the other sub regions. In FIG. 1B, reference numeral 2903 denotes a sub region (wiring inhibition region) in which wiring is inhibited. Here, three kinds of wiring rules may be assumed: a wiring rule applied to the sub region 2902, a wiring rule applied to the wiring inhibition region 2903 (wiring rule for inhibiting the wiring), and a wiring rule applied to portions other than these sub regions.

Each of the lines, which are drawn in the vertical and horizontal directions in the sub region 2902, shows a position at which a wiring can be arranged. An intersection of the vertical and horizontal lines may be set as a grid point. Also, in portions other than the sub region 2902, an intersection of the vertical and horizontal lines is similarly set as a grid point. The interval between the lines drawn in the vertical and horizontal directions in the sub region 2902 may be set to a half of the interval between the vertical and horizontal lines in the other portions. For this reason, the wiring rule applied to the sub region 2902 may be defined as a "narrow pitch region rule". The wiring rule applied to the portions other than the sub region 2902 and the wiring inhibition region 2903 may be defined as a "standard rule". Further, in FIGS. 1A and 1B, It may be assumed the horizontal direction may be described as the H direction and that the vertical direction may be described as the V direction.

The sub region 2902 is a region in which a component, such as a BGA having many pins, may be mounted. The narrow pitch region rule may be set so that the wiring can be performed in the region in which such component may be mounted. In the sub region 2902, a pin of the mounted component is shown by a dot denoted by reference numeral 2904. The wiring inhibition region 2903 is secured in order that, for example, the other wiring, a component, or the like, is arranged in the region.

The number of wiring tracks (straight lines across the entire G-cell 2901) in each of the V and H directions may be changed by the sub region 2902, the wiring inhibition region 2903, and the applied wiring rule. For example, as shown by a mark "○" in FIG. 1B, when the narrow pitch region rule is adopted in the H direction, the number of wiring tracks may be set to five, while when the standard rule is adopted, the number of wiring tracks may be set to two. Similarly, when the narrow pitch region rule is adopted in the V direction, the number of wiring tracks may be set to three, while when the standard rule is adopted; the number of wiring tracks may be set to one.

In this way, the number of wiring tracks calculated as the wiring resource may be changed by the applied wiring rule. Further, the wirings passing through regions, to which different wiring rules are respectively applied, are restricted by each of the wiring rules. For example, in the G-cell 2901 in which the standard rule and the narrow pitch region rule mixed exist, the pitches between grid points are different as illustrated in FIG. 1B. Thus, when the standard rule is adopted, there are generated, in the sub region 2902, grid points which cannot be used for wirings passing through the boundary of the sub region 2902.

The grid points which cannot be used in the sub region 2902 can be used when the narrow pitch region rule is applied to the region other than the sub region 2902. However, a violation which is caused is different for each of the wiring rules. For this reason, unsuitable wiring may be performed in the region to which there is applied a wiring rule other than the wiring rule to be originally applied. In order to avoid the unsuitable wiring, the wiring region may be divided into small regions so as to allow only a single wiring rule to be applied to each of the divided small regions.

Each sub region, to which wiring rules are applied, is divided into small regions, or divided into further smaller regions, and thereby the each sub region can be divided into small regions, to each of which only a single wiring rule is allowed to be applied. However, many small regions with a smaller size may be generated. In the example illustrated in FIG. 1B, when each sub region is divided into small regions, many smaller G-cells, to which the standard rule is applied, are generated around the sub region 2902. With the increase in the number of the small regions which are used as a unit of wiring, calculation time required for automatic wiring is exponentially increased.

In an exemplary embodiment, a wiring region is divided into small regions to which a single wiring rule is applied, while the number of small regions used as the unit of wiring is suppressed.

Figure 2:
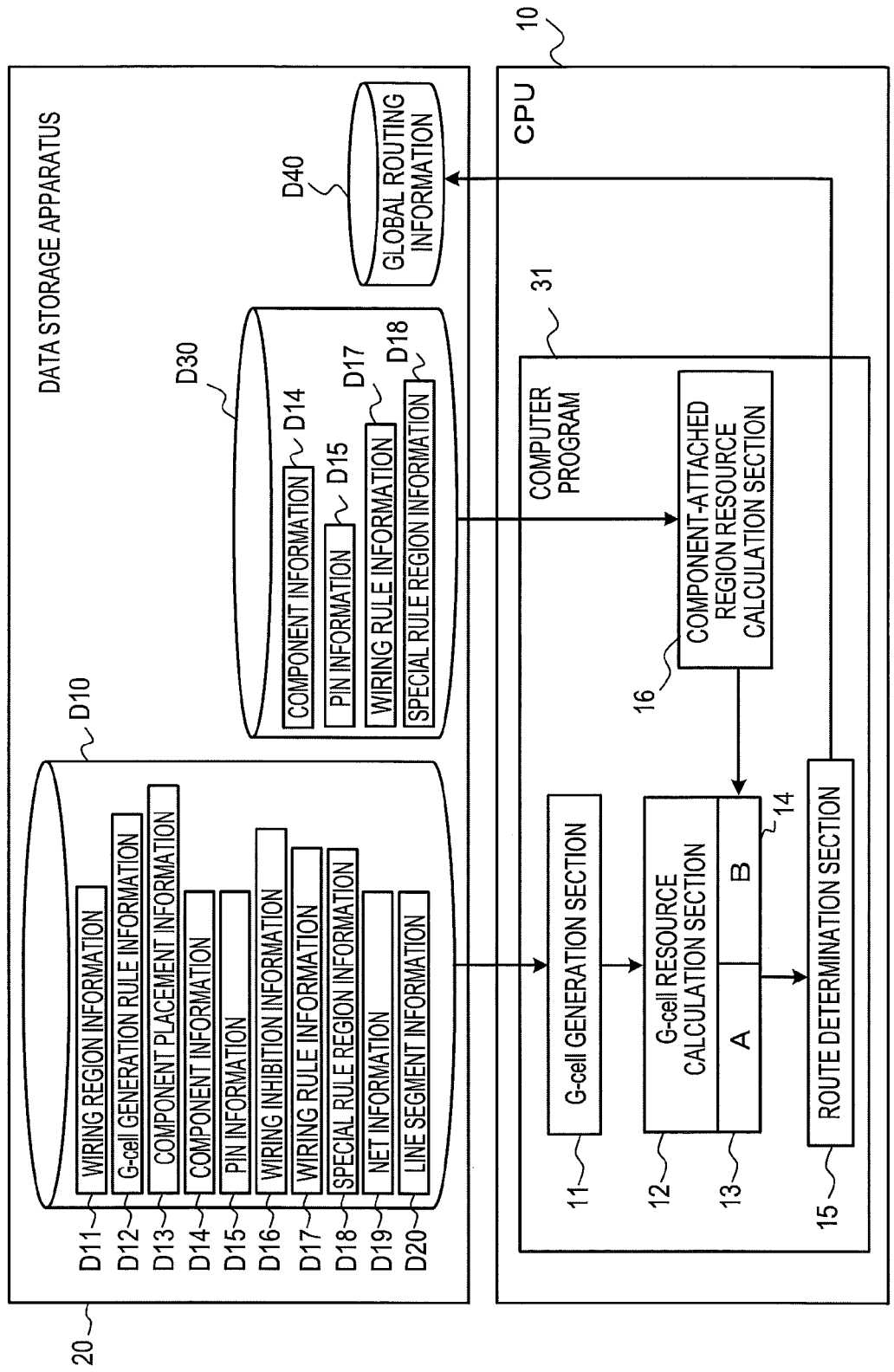
FIG. 2 illustrates a system configuration of an automatic wiring apparatus according to an exemplary embodiment.
Figure 3:
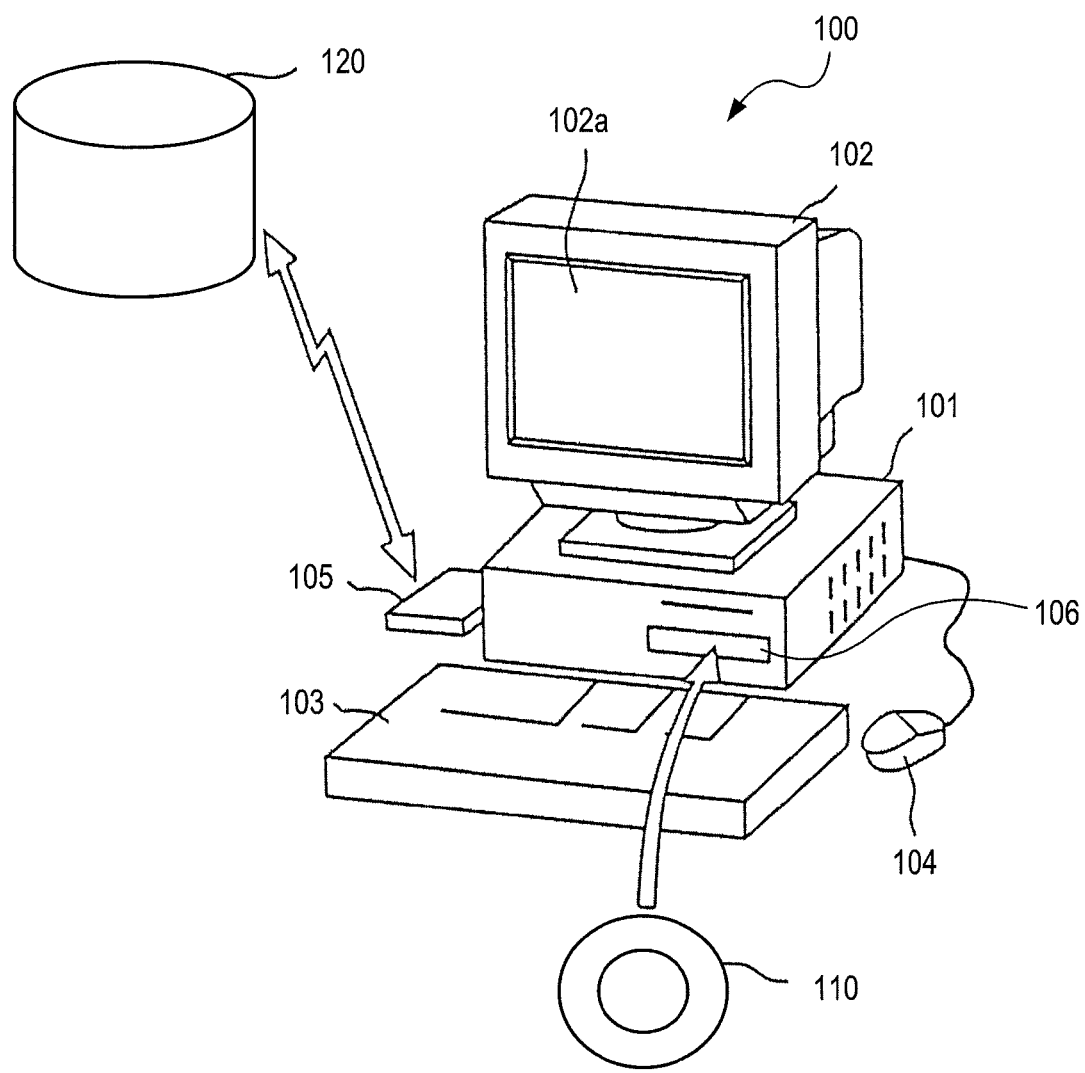
FIG. 3 illustrates a computer system.

FIG. 2 illustrates a system configuration of an automatic wiring apparatus according to an exemplary embodiment. FIG. 3 illustrates a method for constructing the automatic wiring apparatus.

As illustrated in FIG. 2, the automatic wiring apparatus includes a computer 10, a hard disk apparatus which can be accessed by the computer 10, a flash memory, a medium drive apparatus (for example, an optical disk apparatus), and a data storage apparatus 20 which is an external device (for example, a database (DB) server) connected to the computer 10 via a communication network (not shown). As illustrated in FIG. 3, the automatic wiring apparatus is realized in such a manner that the computer 10 reads, via a medium reader 40, a computer program 31 having functions as will be described below from a recording medium 30 in which the computer program 31 is recorded, and that the computer 10 executes the read computer program 31. The program (hereinafter referred to as "automatic wiring program") 31 may also be distributed via the communication network or a storage apparatus, such as a hard disk apparatus.

The automatic wiring apparatus performs automatic wiring with respect to a chip in which the placement of cells is determined by a layout design, or a printed circuit board in which the placement of components is determined. The method of performing the automatic wiring is not significantly different for the objects, and hence, here, only a printed circuit board is, for convenience, assumed as the object.

The computer 10 which configures the automatic wiring apparatus includes, for example, one or more CPUs, a semiconductor memory, an external storage apparatus, an interface for accessing the medium reader 40, an interface for accessing the data storage apparatus 20, and a communication controller which performs communication via a communication network. The automatic wiring program 31 recorded in the recording medium 30 or the external storage apparatus is eventually read out to the semiconductor memory, so as to be executed by the CPU. The CPU executes the automatic wiring program 31, and thereby the automatic wiring apparatus is realized. A G-cell generation section 11, a G-cell resource calculation section 12, a route determination section 15, and a component-attached region resource calculation section 16, which are illustrated in FIG. 2, are components which may be realized by the CPU executing the automatic wiring program 31.

FIG. 3 illustrates a computer system that is an automatic wiring apparatus.

A computer system 100 illustrated in FIG. 3 includes a main body section 101 which incorporates a CPU, a semiconductor memory, a medium drive apparatus 106, an external storage apparatus, and the like, a display 102 which displays an image based on an instruction from the main body section 101, a keyboard 103 for inputting various information into the computer system 100, a mouse 104 which specifies an arbitrary position on a display screen 102a of the display 102, and a communication apparatus 105 which is capable of accessing an external database, or the like, via a communication network so as to download a program, and the like, stored in the other computer system. The communication apparatus 105 is, for example, a network communication card, a modem, or the like. The program (CAD software), which is read by the medium drive apparatus 106 from a portable type recording medium, such as a disk 110, or downloaded from a recording medium 120 of the other computer system by using the communication apparatus 105 so as to enable the computer system 100 to realize at least CAD functions, is input, for example, into the computer system 100 and compiled. The automatic wiring program 31 is input as one of the programs input into the computer system 100 or a part of the input program.

The compiled program is executed by the CPU mounted in the main body section 101. By the execution of the program, the computer system 100 may operate as a design support system having design support functions which support the design of a semiconductor integrated circuit and a printed circuit board. The program may be stored in a computer readable recording medium, such as, for example, the disk 110. The computer readable recording medium is not limited to portable type recording media, such as the disk 110, an IC card memory, a magnetic disk, such as a floppy disk (registered trademark), a magneto-optical disk, and a CD-ROM, and includes various recording media which can be accessed by the computer system connected via the communication apparatus 105 or the other communication apparatus. The program including the automatic wiring program 31 may be in the compiled state.

Figure 4:
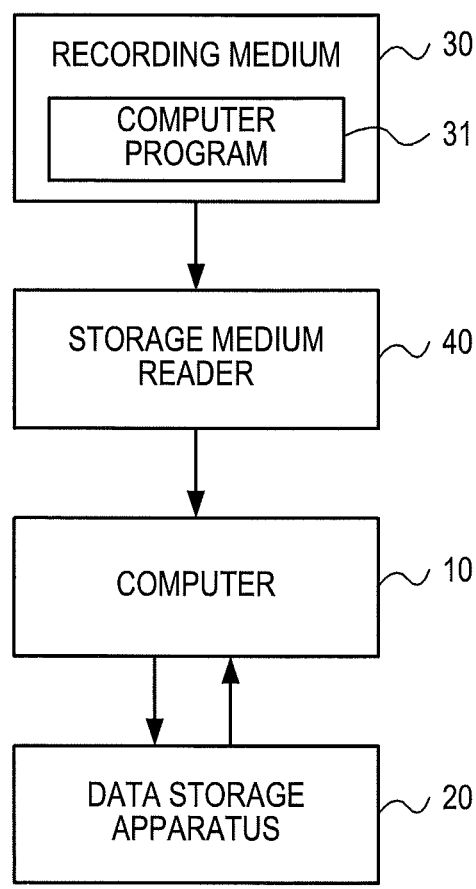
FIG. 4 illustrates a construction method of the automatic wiring apparatus according to an exemplary embodiment.

When the method illustrated in FIG. 4 is applied to the computer system 100 illustrated in FIG. 3, the disk 100 corresponds to the recording medium 30 in which the automatic wiring program 31 is stored, and the medium reader 40 corresponds to the medium drive apparatus 106. The computer 10 corresponds to, for example, the computer system 100. The data storage apparatus 20 corresponds, for example, to the external storage apparatus mounted to the main body section 101. The correspondence relationship is an example, and may be changed according to a system configuration.

The G-cell generation section 11 receives a data group D10 from the data storage apparatus 20, so as to divide a wiring region into G-cells. The division result is output to the G-cell resource calculation section 12 as G-cell information.

The data group D10 includes wiring region information D11, G-cell generation rule information D12, component placement information D13, component information D14, pin information D15, wiring inhibition information D16, wiring rule information D17, special rule region information D18, net information D19, and line segment information D20. These kinds of information are described as follows. FIG. 5 to FIGS. 10A-10C illustrates respective kinds of information D11 to D19 and the G-cell information.

The wiring region information D11 represents a target region of automatic wiring. The target region has a rectangular shape and hence is managed by two opposite vertexes of the rectangular shape. The coordinates of one of the two vertexes may be set as start coordinates, and the coordinate of the other vertex may be set as end coordinates. As the coordinates, the XY coordinates are adopted.

The G-cell generation rule information D12 defines a rule based on which a wiring region is divided into G-cells. The rule includes the width of G-cell on the X and Y axes. The component placement information D13 represents a position of each component arranged in the wiring region.

Figure 5:
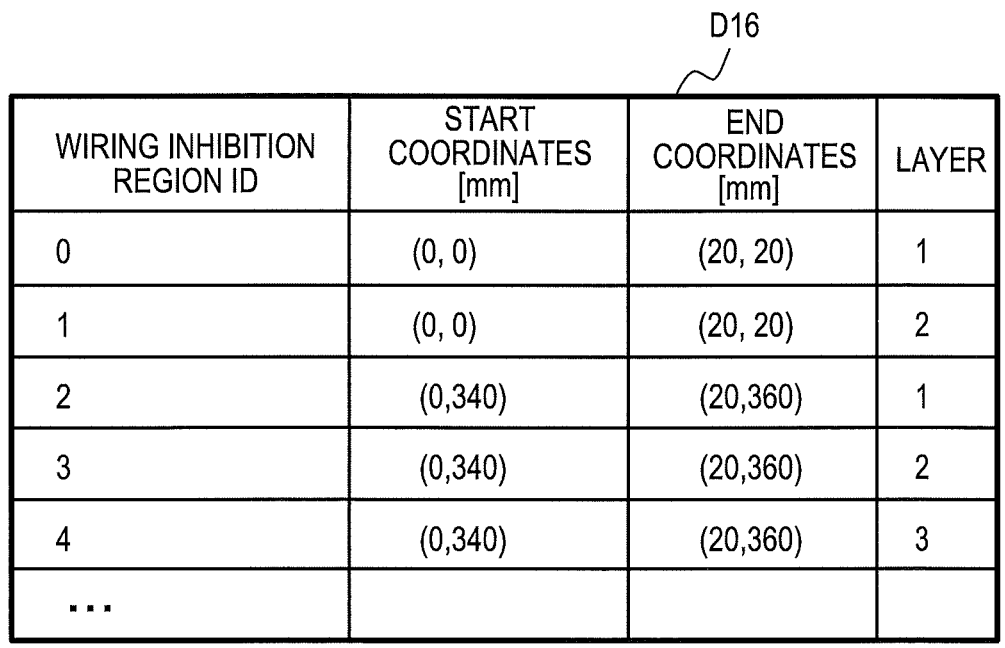
FIG. 5 illustrates a data configuration of wiring inhibition region information D16.

FIG. 5 illustrates a data configuration of the wiring inhibition region information D16. The wiring inhibition region specifies a region which is included in the wiring region represented by the wiring region information D11, and in which wiring is inhibited. The wiring inhibition region information D16 represents the range of the wiring inhibition region for each of the wiring inhibition regions. An identification ID is assigned to each of the wiring inhibition regions. The wiring inhibition region information D16 includes data for respective items of ID, start coordinates, end coordinates, and layer.

The wiring inhibition region has a rectangular shape. The coordinates of two opposite vertexes on the XY plane are used as the start coordinates and the end coordinates of the wiring inhibition region. The wiring inhibition region, to which the wiring inhibition region ID of 0 is assigned, is represented as a region in which the XY coordinate values are both set in the range from 0 to 20. The regions other than the wiring inhibition region are also set to have a rectangular shape, and hence the range of each of the regions is represented by the start and end coordinates of the rectangular shape. Here, it may be assumed that the direction in parallel with the X-axis is referred to as the H direction, and that the direction in parallel with the Y-axis is referred to as the V direction.

Figure 6:
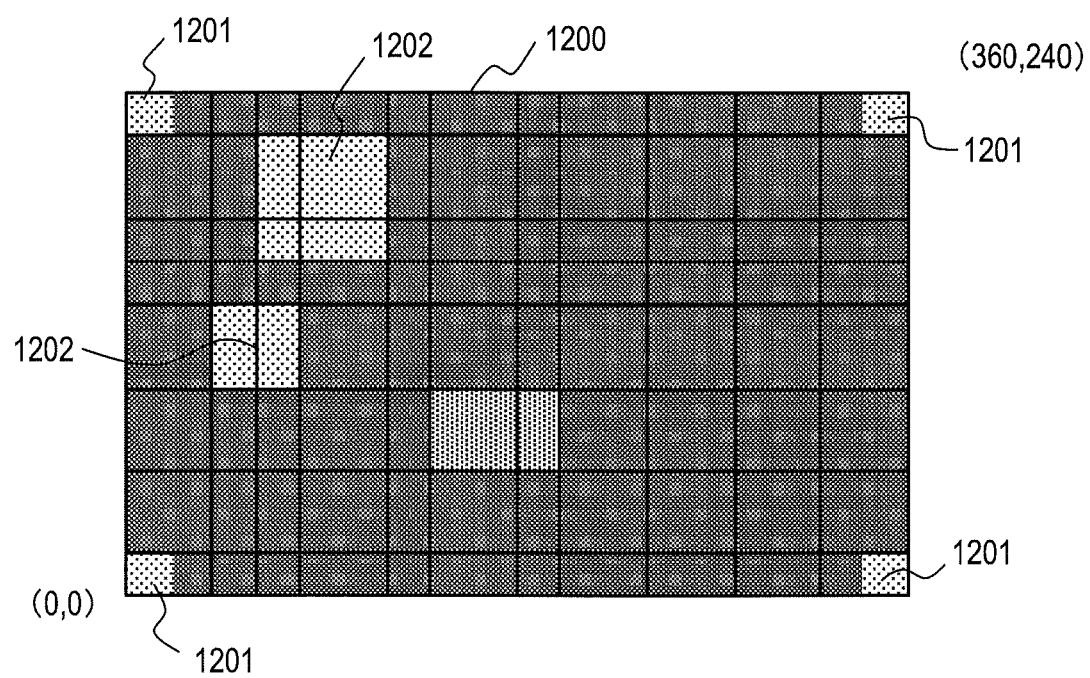
FIG. 6 illustrates examples of sub regions set in a wiring region.

FIG. 6 illustrates examples of sub regions set in a wiring region. In the wiring region, a sub region, to which a wiring rule (hereinafter collectively referred to as "special rule") different from a normal wiring rule (hereinafter referred to as "standard rule") is applied, can be set in addition to the wiring inhibition region. In FIG. 6, reference numeral 1201 denotes a wiring inhibition region, and reference numeral 1202 denotes a sub region (hereinafter referred to as "special rule region") to which a special rule is applied. In the wiring inhibition region 1201 located in the lower left portion of FIG. 6, the first layer corresponds to the wiring inhibition region with the wiring inhibition region ID of 0.

FIG. 7 illustrates a data configuration of the special rule region information D18. The special rule region information D18 stores a range of the region to which the special rule is applied, a component which is arranged in the region, and a wiring resource. Thus, the special rule region information D18 includes data for respective items of ID (special rule region ID) for identifying the special rule region, ID (wiring rule ID) which indicates a wiring rule (special rule) applied to the special region, start coordinates, end coordinates, layer, ID (component ID) of a component arranged in the special region, the number of empty wiring tracks, and the number of empty grids. In FIG. 7, "nil" represents that the corresponding item is not defined. The same is also applied to the other figures.

FIG. 8 illustrates a data configuration of the pin information D15. The pin information D15 represents the details of the shape and position, and the like, of each pin of a component, and the like. As illustrated in FIG. 8, the pin information D15 includes data for respective items of ID (pin ID) for identifying a pin, center coordinates of the pin, pin shape, layer in which the pin exists, X direction dimension, Y direction dimension, and discrete information representing whether or not the pin is connected. The pin shape is expressed by a numerical value assigned for each pin shape. The circular pin shape may be set to 0, and the rectangular pin shape may be set to 1. The layer represents a range in which the pin exists and which is expressed by two numerical values. The numerical values of (1, 6) represents that the pin exists in the range from the first layer to the sixth layer. The discrete information is configured such that 'discrete' (non-connection) is expressed by 1 and that 'connection' is expressed by 0. The pin which is connected, that is, made conductive with a semiconductor component corresponds to a conductive section.

FIG. 9 illustrates a data configuration of the wiring rule information D17. The wiring rule information D17 defines, for each wiring rule, conditions which are to be satisfied by a wiring. The wiring rule information D17 includes data for respective items of wiring rule ID, layer to which the rule is applied, wiring width, and minimum gap (clearance) to be satisfied. The gap is defined for each combination of adjacent objects. As combinations of the adjacent objects, two combinations of a pin and a wiring, and of wrings are illustrated in FIG. 9.

Figure 10A:
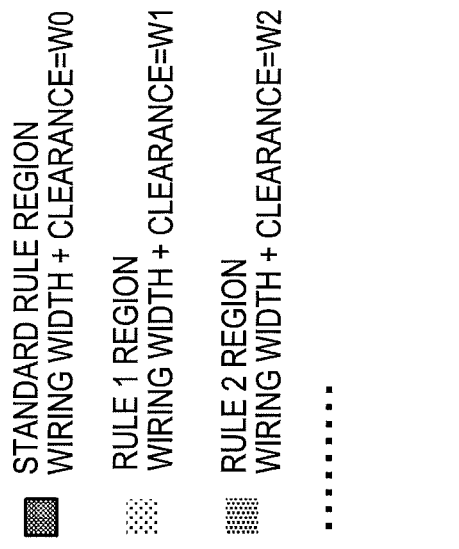
FIGS. 10A-10C illustrate differences between wiring rules respectively applied to sub regions.
Figure 10C:
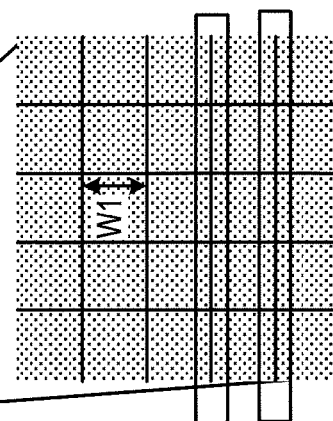
Figure 10B:
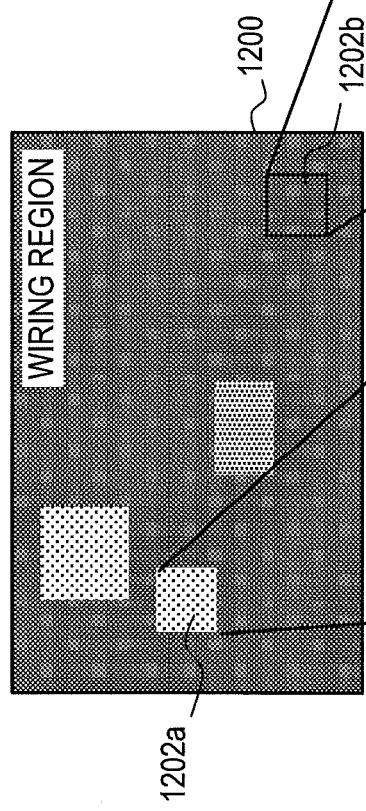

FIGS. 10A-C illustrate a difference between wiring rules respectively applied to sub regions. In the details of sub regions 1202*a* and 1202*b*, the lines extended in the vertical and horizontal directions represent portions which can be selected as wiring routes. An intersection of the vertical and horizontal lines corresponds to a grid point. Each of reference characters W1 and W0 which are respectively shown in the sub regions 1202*a* and 1202*b* denotes a pitch obtained by adding the wiring (wire) width and the gap between the wirings.

FIG. 11 illustrates a data configuration of the net information D19. The wiring rule of the region in which the wiring is inhibited is hereinafter described as "non-allowable wiring rule". The net information D19 includes data for respective items of net ID for identifying a wiring as a target of automatic wiring, ID of wiring rule to be applied, non-allowable wiring rule ID, pin ID representing a pin to be connected by the wiring, line segment ID representing a line segment as a portion configuring the wiring, the number of violations among the line segments represented by the segment IDs or the number of wirings which are not arranged.

As illustrated in FIG. 9, the gap (clearance) is different between the wiring rules of 0 and 1. Thereby, a violation is caused when a wiring, to which the wiring rule with the ID of 0 is applied, is made to pass through a region to which the wiring rule with the ID of 1 is applied. For this reason, a non-allowable wiring rule is defined. The non-allowable wiring rule can be defined by applying only a single wiring rule to each of G-cells.

FIGS. 12A AND 12B illustrates a wiring route determined Where a special rule region exists between two G-cells between which a wiring is to be determined. The two G-cells are a G-cell 1203S and a 0-cell 1203T. There is a sub region 1202 between the two G-cells. A wiring route which connects the G-cells 1203S and 1203T to each other is expressed by a dotted line in FIGS. 12A AND 12B. Reference character 1203S denotes the start point of the wiring route, and reference character 1203T denotes the end point of the wiring route. Reference numeral 1203 denotes a G-cell.

When the non-allowable wiring rule is not applied to the sub region 1202, the wiring route between the G-cells 1203S and 1203T is determined so as to pass through the sub region 1202 as illustrated in FIG. 12A. However, when the non-allowable wiring rule is applied to the sub region 1202, the wiring route between the G-cells 1203S and 1203T is determined so as to avoid the sub region 1202 as illustrated in FIG. 12B.

Figure 13:
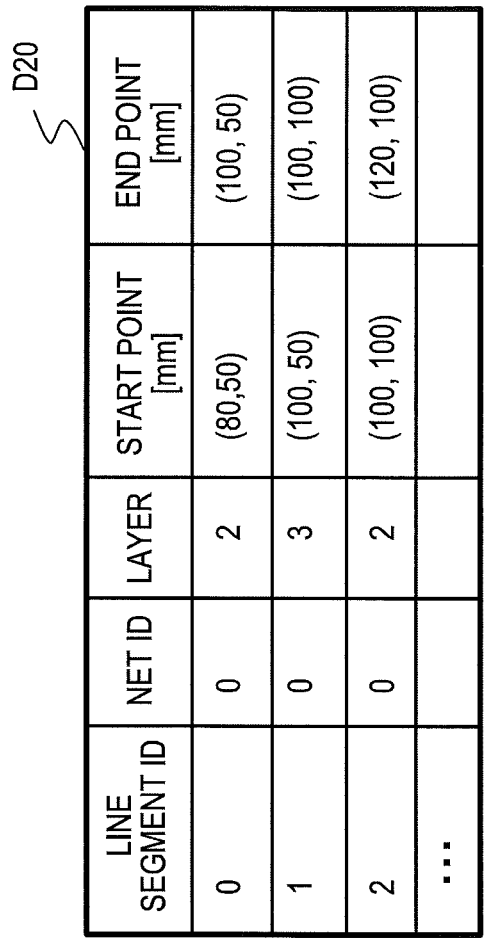
FIG. 13 illustrates a data configuration of line segment information D20.

FIG. 13 illustrates a data configuration of line segment information D20. A wiring which connects between pins may be made to pass through a plurality of layers. The wiring route of such wiring is determined for each layer. The line segment information D20 stores such portions (line segments) obtained by dividing the wiring route into each of the layers. As illustrated in FIG. 13, the line segment information D20 includes data for respective items of line segment ID for identifying a line segment, net ID of a corresponding wiring route, layer, start point of the line segment, and the end point of the line segment.

FIG. 14 illustrates a data configuration of the component information D14. The component information D14 stores information relating to a wiring for each component. As illustrated in FIG. 14, the component information D14 includes data for respective items of component ID, the number of pins in each of the H and V directions, gap between the pins arranged in each of the H and V directions, and pin size in each of the H and V directions.

FIG. 15 illustrates a data configuration of the G-cell information D1. The G-cell information D14 stores information relating to the range and wiring for each of G-cells 1203. As illustrated in FIG. 15, the G-cell information D14 is configured to include ID for identifying the G-cell 1203, start and end coordinates representing the region, layer, special rule region ID, the number of wiring tracks estimated as wiring resources in the H and V directions, the number of grids estimated as a wiring resource, the number of consumed resource grids, label propagation parent G-cell ID, label value, flag representing that the G-cell is one of the source (S) and the target (T) at the time when a wiring route is searched for the G-cell 1203, and the number of consumed wiring tracks (the number of grids) for each four sides of the G-cell 1203.

The number of consumed resource grids, the number of consumed wiring tracks, the label propagation parent G-cell ID, the label value, and the flag are updated by the route determination section 15.

FIGS. 16A-16H illustrates a relationship between the G-cell information D1 and the information D14 to D20. As illustrated in FIGS. 16A-16M, except the wiring inhibition information D16, the G-cell information D1 and the information D14 to D20 includes item data which makes it possible to refer to the other information. Thereby, the reference can be successively performed from certain information to the other information.

The G-cell generation section 11 divides a wiring region 1200 into G-cells with reference to the G-cell generation rule information D12. However, when a special rule region exists in the wiring region 1200, the G-cell 1203 in which wiring rules mixed exist may be generated by the division processing. For this reason, the G-cell 1203 in which wiring rules mixed exist is divided into a plurality of small regions by the boundaries of the regions to which the respective wiring rules are applied. The small regions, which satisfy conditions defined beforehand, and to which the same wiring rule is applied, are merged with each other. In this way, the wiring region 1200 is divided into small regions, to each of which a single wiring rule is applied, and the increase in the number of small regions is suppressed. In an exemplary embodiment, the G-cells generated according to the generation rule represented by the G-cell generation rule information D12 are referred to as "primary G-cells", and a part of the G-cells generated by dividing the primary G-cell is referred to as "secondary G-cells".

FIGS. 17A-17B to 19A-19G, and FIGS. 21 and 22 illustrate processing performed by the G-cell generation section 11.

In operation S1, the G-cell generation section 11 generates boundary lines of a primary G-cell in the wiring region 1200 according to a G-cell generation rule represented by the G-cell generation rule information D12, so as to set a rectangle divided by the boundary lines as the primary G-cell. The primary cell is formed in a rectangle having standard dimensions (widths) in the X and Y directions, which are represented by the G-cell generation rule.

In operation S2, as a wiring rule ID of the primary cell included in a special rule region among the primary cells, the G-cell generation section 11 adopts (copies) the wiring rule ID of the special rule applied to the special rule region. Then, the G-cell generation section 11 shifts to operation S3.

FIGS. 17A-17B illustrates a generation method of primary cells, and a primary cell to which a single special rule is applied among the primary cells.

In FIGS. 17A-17B, the lines drawn in the vertical and horizontal directions represent the boundary lines. Thereby, the primary G-cells 1203 illustrated in FIG. 17A are generated.

As illustrated in FIG. 17B, the special rule region 1202 has the primary G-cell 1203 all of which is included in the special rule region 1202. A single special rule is applied to the primary G-cell 1203. Therefore, the primary G-cell 1203 is excluded from the primary G-cells to be divided into secondary G-cells.

The special rule region 1202 and the other special rule regions 1202 have the primary G-cell 1203 in which wiring rules mixed exist. In operation S3, the G-cell generation section 11 divides the primary G-cell 1203, in which wiring rules mixed exist, into secondary G-cell cells, and performs merge processing to merge the secondary G-cells to be merged. In operation S4, the G-cell generation section 11 registers the primary G-cell 1203 which is not divided into secondary G-cells, the secondary G-cells, and the merged secondary G-cells in the G-cell information D1. After performing the registration, the G-cell generation section 11 ends the G-cell generation processing.

Figure 18A:
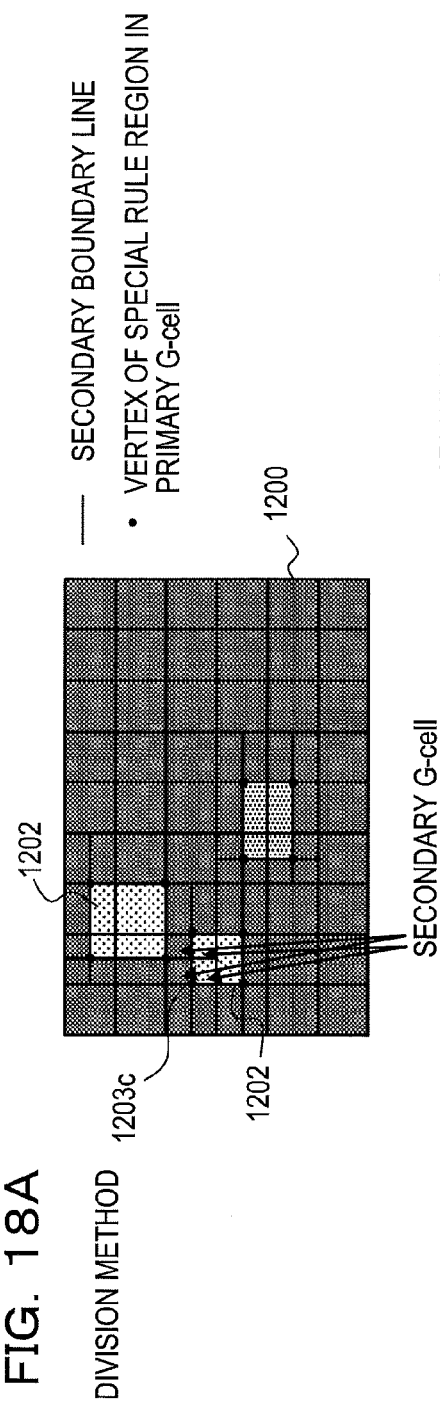
FIGS. 18A-18B illustrate a division method of a primary G-cell into secondary G-cells, and a merge method of the secondary G-cells.
Figure 18B:
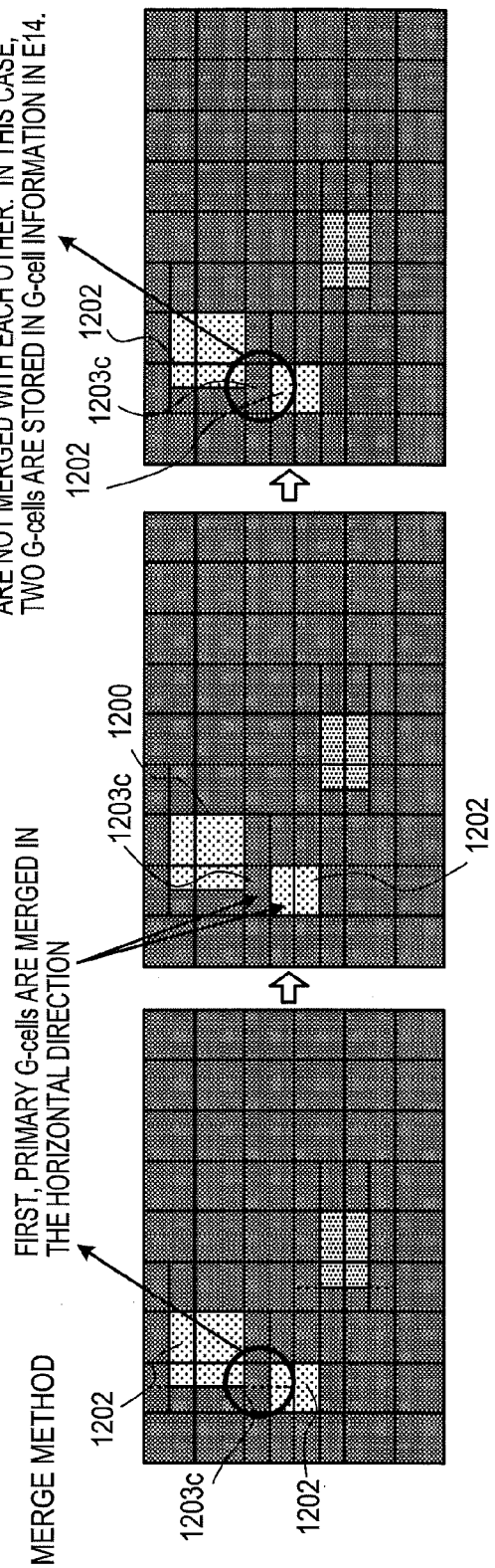
Figure 20:
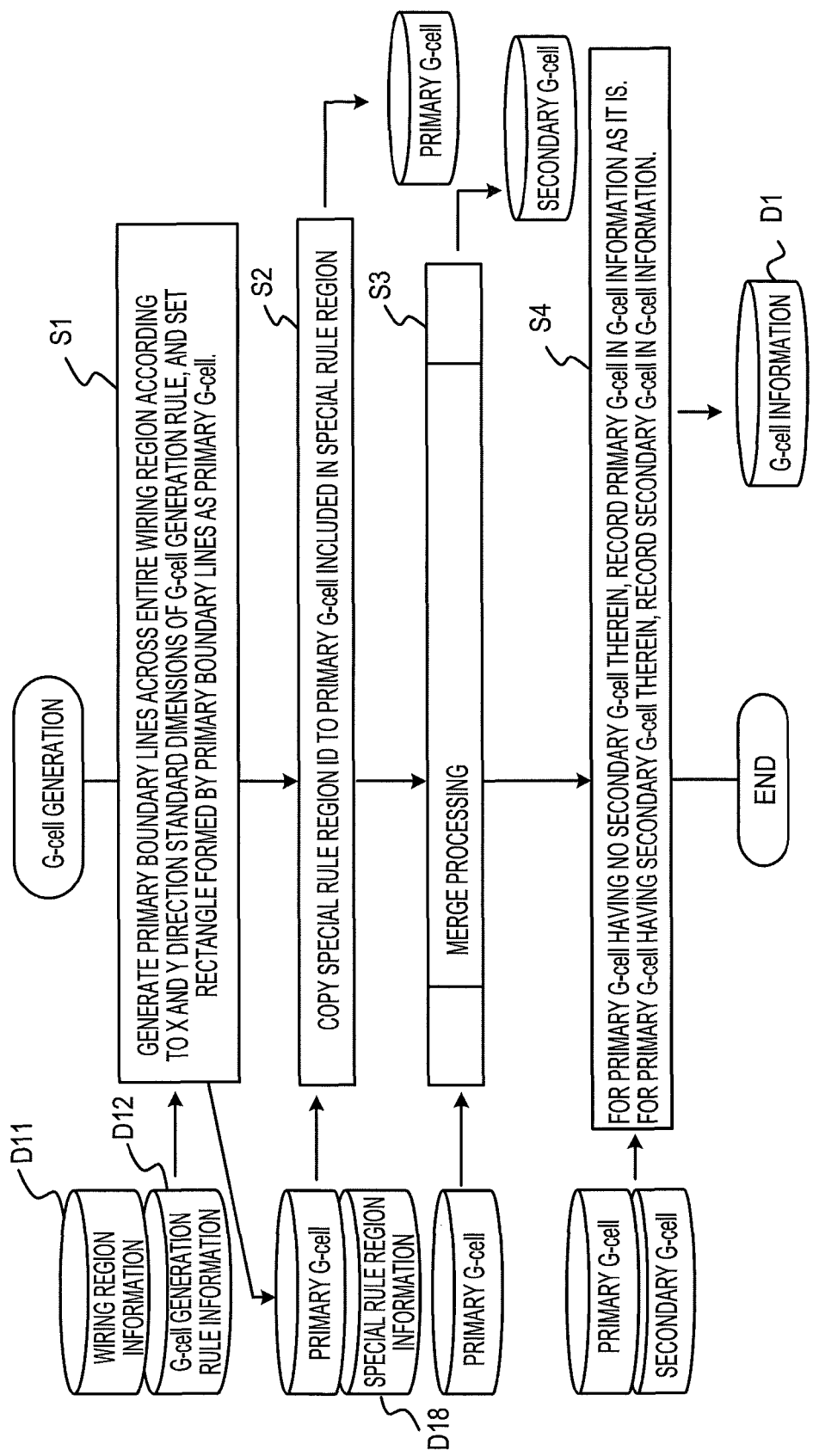
FIG. 20 illustrates G-cell resource calculation A processing.

FIG. 18A illustrates a method of dividing a primary G-cell into secondary G-cells. FIG. 18B illustrates a method of merging the secondary G-cells.

As illustrated in FIG. 18A, the method of division into the secondary G-cells extracts, from the vertexes of the special rule region 1202, the vertexes which are not coincident with the vertexes of the primary G-cell. Next, vertical and horizontal lines passing through the extracted vertexes are extended until they become in contact with the boundary lines generated in operation S1. The lines added to the lines in FIGS. 17A-B are generated based on the extracted vertexes. In FIG. 18A, the vertexes of the special rule region 1202 are expressed by dots.

A primary G-cell 1203c is divided into four secondary G-cells by the vertical and horizontal lines passing through the extracted vertexes. In the primary G-cell 1203c, secondary G-cells, which are adjacent to each other in the horizontal (H) direction and which satisfy the condition that the same wiring rule is applied, are first merged with each other. By the merge processing, the primary G-cell 1203c includes two secondary G-cells as illustrated in FIG. 18B.

Next, secondary G-cells, which are adjacent to each other in the vertical (V) direction and which satisfy the condition that the same wiring rule is applied, are merged with each other. The wiring rules respectively applied to the two secondary G-cells existing in the primary G-cell 1203c are different from each other. For this reason, the secondary G-cells are not merged with each other.

FIG. 19 illustrates the merge processing performed by the G-cell generation section 11 as operation S3 as described above. FIGS. 20A-20G illustrates the processing contents of the main operations of the merge processing.

In operation S11, the G-cell generation section 11 selects one of the unprocessed primary G-cells 1203. In Operation S12, the G-cell generation section 11 extracts the vertexes of the special rule region which exists in the selected primary G-cell 1203. The G-cell generation section 11 stores the coordinates of the extracted vertexes. At this time, as described above, the G-cell generation section 11 excludes the vertexes whose coordinates coincide with those of the vertexes of the primary G-cell 1203 from the objects to be extracted. Then, the G-cell generation section 11 shifts to operation S13.

In operation S13, the G-cell generation section 11 determines whether or not vertexes of the special rule region, which are to be extracted, exist in the selected primary G-cell 1203. When there is no vertex to be extracted, the G-cell generation section 11 determines as NO and returns to operation S11 as described above. When there are vertexes to be extracted, the G-cell generation section 11 determines as YES, and shifts to operation S14.

In operation S14, the G-cell generation section 11 generates vertical and horizontal lines (secondary parting line) passing through the extracted vertexes. In operation S15, the G-cell generation section 11 divides the primary G-cell 1203 into a plurality of secondary G-cells by the boundary lines (sides) of the primary G-cell 1203 and the secondary parting lines. In operation S16, among the divided secondary G-cells, the G-cell generation section 11 copies (sets) the ID of the special rule region to the secondary G-cells which are included in the special rule region. By the copy processing, the special rule applied to each of the secondary G-cells can be distinguished. In FIGS. 19A-19G, the secondary G-cells, to which the special rule region ID is assigned, are represented by numbers from 1 to 9. After performing the copy processing, the G-cell generation section 11 shifts to operation S17.

In operation S17, the G-cell generation section 11 merges the secondary G-cells, which are adjacent to each other in the horizontal (H) direction, and which satisfy the condition of having the same special rule region ID, into one secondary G-cell. In operation S18, the G-cell generation section 11 merges the secondary G-cells, which are adjacent to each other in the vertical (V) direction, and which satisfy the condition of having the same special rule region ID, into one secondary G-cell.

By the merge processing, the total nine secondary G-cells are formed as represented by numbers from 1 to 9 in FIGS.

19A-19G. Thereby, the increase in the number of the secondary G-cells is significantly suppressed by the merge processing of the secondary G-cells.

The merge processing is performed with respect to the secondary G-cells having the same width, as illustrated in FIGS. 19A-19G. Since both of the primary G-cell 1203 and the special rule region 1202 have rectangular shapes, the widths of the adjacent secondary G-cells in the special rule region 1202 are coincident with each other in both the vertical and horizontal directions. Therefore, the adjacent secondary G-cells can be merged into one secondary C-cell.

The G-cell generation section 11 performs the processing in operation S18, and thereby ends the processing with respect to one primary G-cell 1203 in which wiring rules mixed exist. All of the secondary G-cells eventually obtained are registered in the G-cell information D1 for the one G-cell 1203.

Even when the processing to the one primary G-cell 1203 is ended, there may exist other primary G-cells to be processed. After operation S18, the G-cell generation section 11 determines whether or not there exists a primary G-cell 1203 which is not processed (not illustrated in FIG. 19). When an unprocessed primary G-cell 1203 exists, the G-cell generation section 11 returns to operation S11. When no unprocessed primary G-cell 1203 exists, the G-cell generation section 11 ends here the merge processing. The merge processing illustrated in FIG. 19 is performed with respect to one primary G-cell in which wiring rules mixed exist.

In order to realize the G-cell generation section 11, the above described processing is performed by the computer 10. The execution result is transferred to the G-cell resource calculation section 12.

The G-cell resource calculation section 12 includes a G-cell resource calculation section A 13 and a G-cell resource calculation section B 14. The G-cell resource calculation section B 14 calculates a wiring resource of a G-cell 1203 to which a special rule is applied, based on a relationship with a component. The G-cell resource calculation section A 13 calculates a wiring resource of a G-cell 1203 to which a wiring rule is applied without taking such relationship into consideration. The G-cell resource calculation section A 13 and the G-cell resource calculation section B 14 are realized by performing the following processing, respectively. The processing is described with reference to FIG. 21 and FIG. 22.

It may be configured such that the determination on whether or not a special rule is applied, which determination is performed based on the relationship with a component, is performed, for example, by determining whether or not a value other than 0 is stored as the component ID in the special rule region information D18. This is because the value other than 0 indicates that a certain component may be mounted and because it can be considered that a special rule may be applied due to the mounting of the component.

Figure 21:
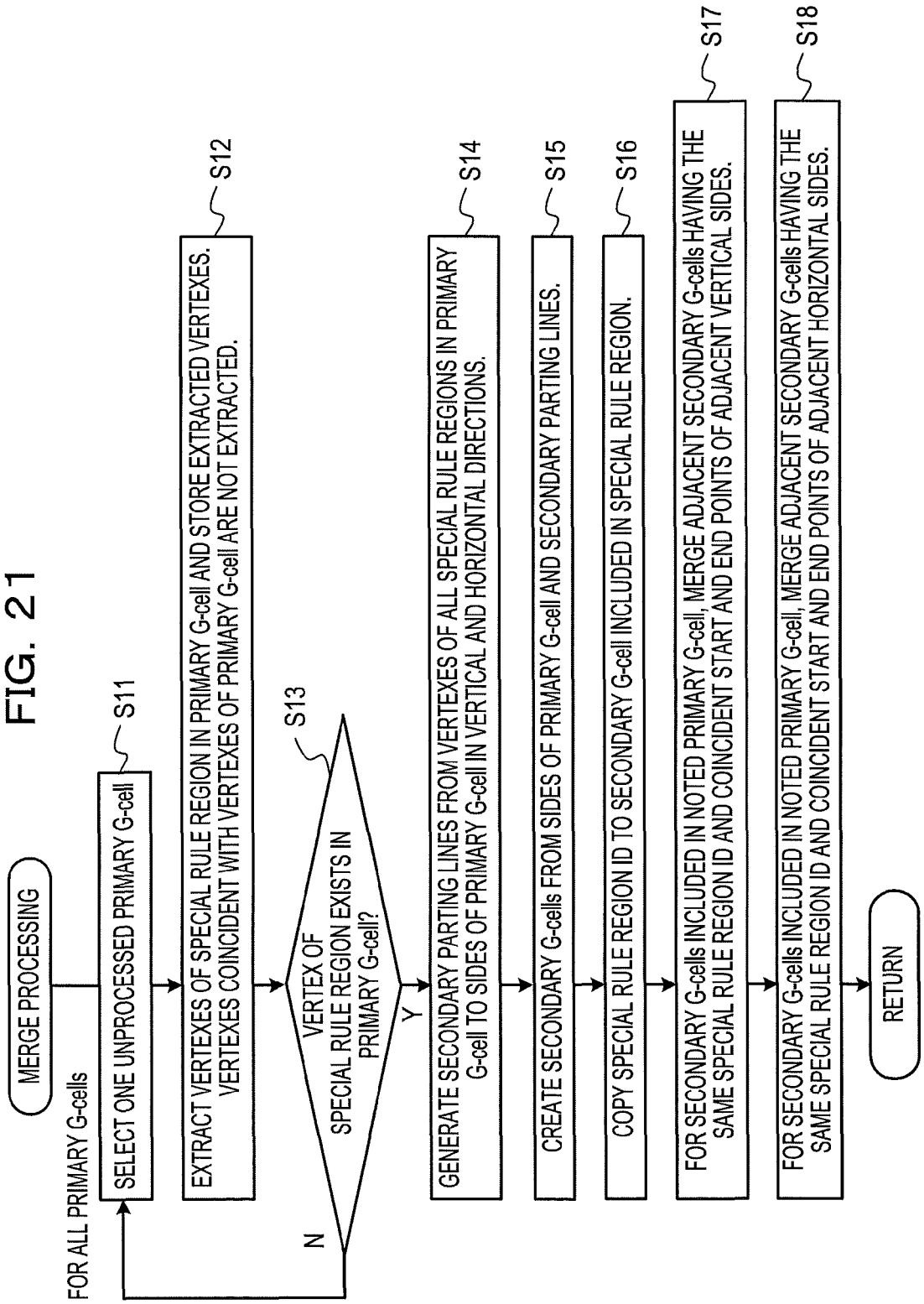
FIG. 21 illustrates merge processing.
Figure 22:
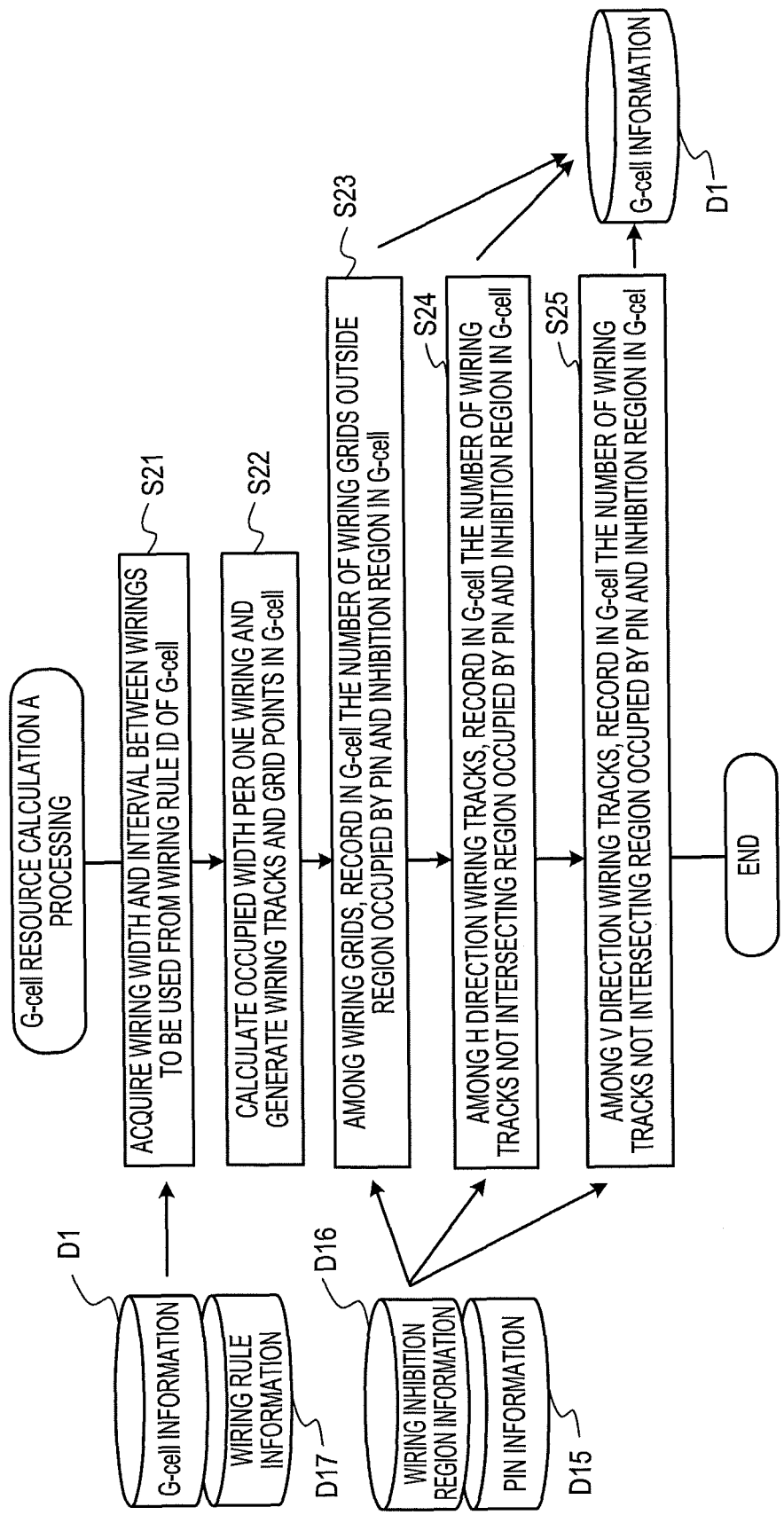
FIG. 22 illustrates G-cell resource calculation A processing.

FIG. 21 illustrates the G-cell resource calculation A processing performed by the G-cell resource calculation section A 13. First, the G-cell resource calculation A processing will be described in detail with reference to FIG. 21. The processing, which is performed in order to calculate the wiring resource of one G-cell 1203, is extracted and illustrated in FIG. 21.

In operation S21, the G-cell resource calculation section A 13 selects one unprocessed G-cell 1203, and based on the ID of the wiring rule applied to the selected G-cell 1203, the G-cell resource calculation section A 13 acquires a wiring width and gaps (at least two types of gaps existing between wirings and between the wiring and a pin) with reference to the wiring rule information D17. In operation S22, the G-cell resource calculation section A 13 calculates the occupied width per one wiring from the wiring width and the gap between the wirings, and generates wiring tracks (vertical and horizontal lines) and grid points in the G-cell 1203 based on the occupied width. In operation S23, the G-cell resource calculation section A 13 calculates, among the grid points, the number of pins existing in the G-cell 1203, or the number of pins not existing within the range occupied by the wiring inhibition region, and records the calculated numbers in the G-cell information D1.

In operation S24, the G-cell resource calculation section A 13 calculates, among the wiring tracks in the horizontal (H) direction, the number of wiring tracks which does not intersect pins existing in the G-cell 1203 or which does not intersect the range occupied by the wiring inhibition region, and records the calculated number in the G-cell information D1. In operation S25, the G-cell resource calculation section A 13 calculates, among the wiring tracks in the vertical (V) direction, the number of wiring tracks which does not intersect pins existing in the G-cell 1203 or which does not intersect the range occupied by the wiring inhibition region, and records the calculated number in the G-cell information D1. By the record processing, the G-cell resource calculation section A 13 ends the processing to the one G-cell 1203. When the other unprocessed G-cell 1203 exists, the G-cell resource calculation section A 13 returns to operation S21. When no other unprocessed G-cell 1203 exists, the G-cell resource calculation section A 13 ends the G-cell resource calculation A processing.

When each of the special rule regions 1202a and 1202b illustrated in FIGS. 10A-10C is the G-cell 1203, to which the standard rule is applied, no pin exists and no wiring inhibition region exists in the special rule region 1202a. The number of the wiring tracks of the special rule region 1202a may be set to 3 in each of the vertical and horizontal (HV) directions, and the number of grids of the special rule region 1202a may be set to 9. No pin exists and no wiring inhibition region exists in the special rule region 1202b. Therefore, the number of wiring tracks may be set to 4 in each of the vertical and horizontal directions, so that the number of grids may be set to 16.

Figure 23:
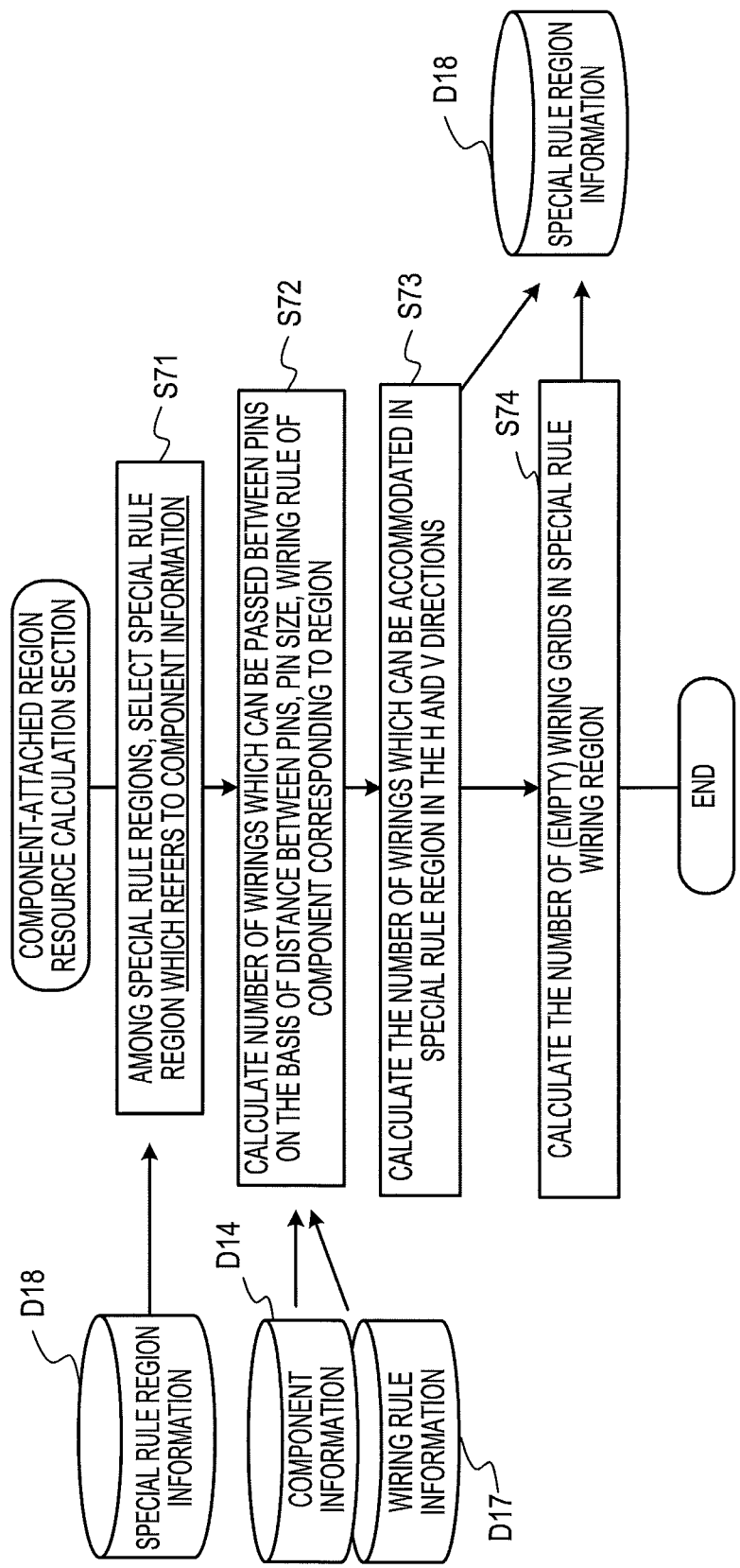
FIG. 23 illustrates component-attached region resource calculation processing.

Based on the wiring resource of the special rule region 1202, the G-cell resource calculation section B 14 calculates the wiring resource of the G-cell 1203 to which the special rule is applied due to a relationship with a component. The wiring resource of the special rule region 1202 is given by the component-attached region resource calculation section 16. FIG. 23 illustrates component-attached region resource calculation processing performed by the resource calculation section 16. An exemplary embodiment shows the calculation of the wiring resource of one special rule region 1202. The resource calculation section 16 calculates the wiring resource with reference to a data group D30 including the component information D14, the pin information D15, the wiring rule information D17, and the special rule region information D18.

In operation S71, the resource calculation section 16 selects one special rule region 1202 which refers to the component information D14. That is, the resource calculation section 16 selects the special rule region 1202 for which a value other than 0 is stored as the component ID in the special rule region information D18. In operation S72, the resource calculation section 16 calculates the number of wirings which can be made to pass between the pins of the component to which the component ID is assigned, based on the interval between the pins (distance between the pins) of the component, the pin size, and the wiring rule to which the wiring rule ID is assigned. Then, the resource calculation section 16 shifts to operation S73.

In operation S73, the resource calculation section 16 calculates the number of wiring tracks which can be accommodated in the special rule region 1202 in the H and V directions, and stores the calculation result as the number of empty wiring tracks in the special rule region information D18. In operation S74, the resource calculation section 16 calculates the number of unused grid points in the special rule region 1202, and stores the calculation result in the special rule region information D18. After storing the calculation results, the resource calculation section 16 ends the processing with respect to the one special rule region 1202. When the other unprocessed special rule region 1202 exists, the resource calculation section 16 returns to operation S71. When no other unprocessed special rule region 1202 exists, the resource calculation section 16 ends here the component-attached region resource calculation processing. As a result, the calculation results obtained by the component-attached region resource calculation section 16 is given as the special rule region information D18 to the G-cell resource calculation section B 14.

Figure 24:
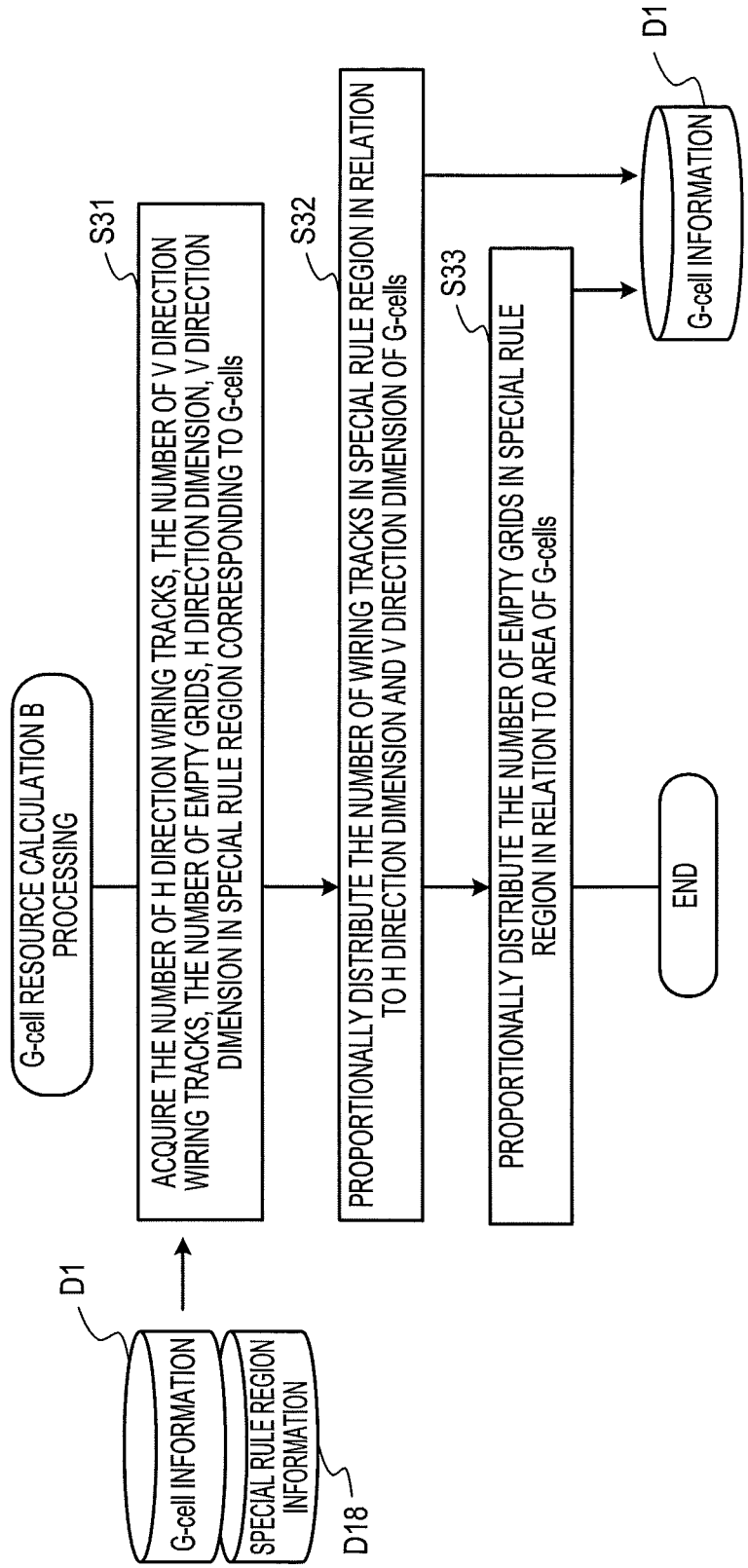
FIG. 24 illustrates G-cell resource calculation B processing.

FIG. 24 illustrates G-cell resource calculation B processing which is performed by the G-cell resource calculation section B 14. An exemplary embodiment shows the calculation of the wiring resource of the G-cell 1203 included in one special rule region 1202.

In operation S31, the G-cell resource calculation section B 14 selects one unprocessed special rule region 1202 with reference to the special rule region information D18. The G-cell resource calculation section B 14 acquires the number of empty wiring tracks in the H direction, the number of empty wiring tracks in the V direction, and the number of empty grids, which are stored as a wiring resource of the selected special rule region 1202, and further acquires start coordinates and end coordinates (described as "H direction dimension and V direction dimension" in the figure). The G-cell resource calculation section B 14 specifies a G-cell 1203 included in the special rule region 1202 indicated by the start coordinates and the end coordinates. Then, the G-cell resource calculation section B 14 shifts to operation S32.

In operation S32, the G-cell resource calculation section B 14 proportionally distributes the number of wiring tracks of the special rule region 1202 according to the dimensions in the H and V directions of the specified G-cell 1203, and stores the distributed results in the G-cell information D1. In operation S33, the G-cell resource calculation section B 14 proportionally distributes the number of empty wiring grids of the special rule region 1202 according to the area of the specified G-cell 1203, and stores the distributed results in the G-cell information D1. After storing the distributed results, the G-cell resource calculation section B 14 ends the processing with respect to the one special rule region 1202. When the other unprocessed special rule region 1202 to be processed exists, the G-cell resource calculation section B 14 returns to operation S31. When no other unprocessed special rule region 1202 to be processed exists, the G-cell resource calculation section B 14 ends here the G-cell source calculation B processing.

FIGS. 25A-25B illustrate a method for distributing the wiring resource of the special rule region 1202 to each of the G-cells 1203. In FIGS. 25A-25B, the lines extended in the H direction and the V direction represents wiring tracks. A round circle denoted by reference numeral 1801 represents a pin. In the special rule region 1202 as illustrated in the upper side of FIGS. 25A-25B, the number of empty wiring tracks is 4 in both the H and V directions, and hence the number of empty grids may be calculated to be 40.

The special rule region 1202 includes four G-cells of Gc1 to Gc4. When the H direction dimension (width) of each of the G-cells of Gc1 to Gc4 is expressed by the number of the rectangles formed by the parting lines which are shown by dotted lines in the figure, the dimension of the Gc1 and the Gc3 is expressed as 11, and the dimension of the Gc2 and the Gc4 is expressed as 5. When the V direction dimension of each of the G-cells of Gc1 to Gc4 is similarly expressed, the dimension of the Gc1 and the Gc2 is expressed as 11, and the dimension of the Gc3 and the Gc4 is expressed as 5. Each area of the G-cells of Gc1 to Gc4 is obtained by multiplying the H direction dimension by the V direction dimension.

As for the number of wiring tracks proportionally distributed in each of the G-cells in the H direction, three wiring tracks are distributed in each of the Gc1 and the Gc2, and one wiring track is distributed in the Gc3 and the Gc4. As for the number of wiring tracks proportionally distributed in each of the G-cells in the V direction, three wiring tracks are distributed in each of the Gc1 and the Gc3, and one wiring track is distributed in the Gc2 and the Gc4. As for number of grids in each of the G-cells, the number of grids in Gc1 may be set to 22, the number of grids in Gc2 may be set to 6, the number of grids in Gc3 may be set to 10, and the number of grids in Gc4 may be set to 2. As for the wiring resource of the G-cells, which is consumed by the wiring arranged on one wiring track in the H direction, three grids are consumed in the Gc1 and Gc3, and one grid is consumed in the Gc2 and Gc4. As for the wiring resource of the G-cells, which is consumed by the wiring arranged on one wiring track in the V direction, three grids are consumed in the Gc1 and Gc2, and one grid is consumed in the Gc3 and Gc4. By a wiring of the G-cells, which is made to pass from H direction to the V direction, or which is made to pass from the V direction to the H direction, six grids are consumed in the Gc1, four grids are consumed in the Gc2 and Gc3, and two grids are consumed in the Gc4. The number of consumed grids may be calculated in consideration of the existence of the pins 1801.

In this way, the wiring resource of each of G-cells 1203 may be calculated by the G-cell resource calculation section 12. The calculation results are stored in the G-cell information D1. For each of the G-cells 1203, the route determination section 15 determines the route of the wiring registered in the net information D19 within the range of the calculated wiring resource.

Figure 26A:
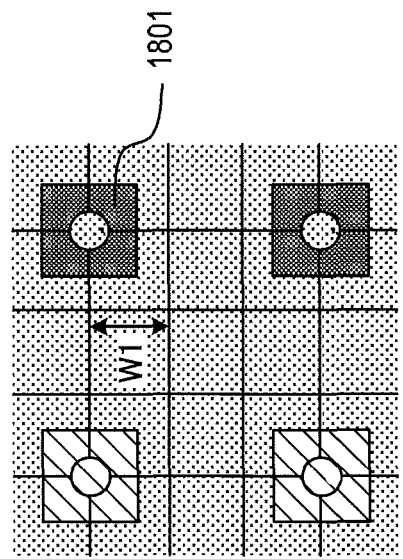
FIGS. 26A-26B illustrate a wiring resource which may be changed by a positional relationship between a wiring track and a pin as an obstacle.
Figure 26B:
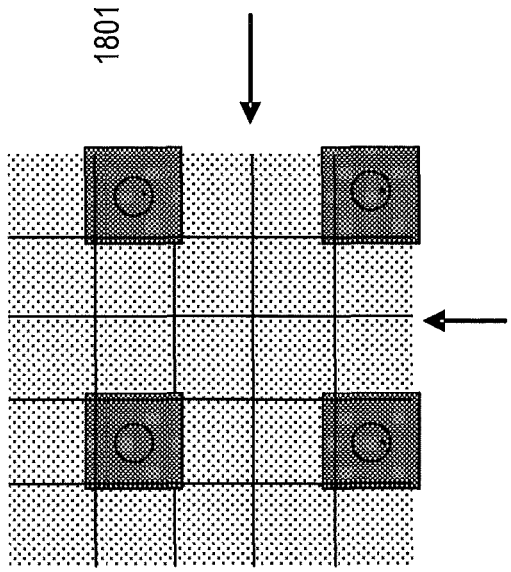

In the region in which a wiring obstacle, such as a pin, exists, the wiring resource may be changed by the positional relationship between the wiring track and the obstacle. FIGS. 26A-26B illustrates the wiring resource which may be changed by the positional relationship between the wiring track and a pin as the obstacle.

FIG. 26A illustrates the case where the positional relationship between the pin 1801 and the wiring track is optimal. FIG. 26B illustrates the case where the positional relationship between the pin 1801 and the wiring track is not optimal. In FIG. 26A and FIG. 26B, the vertical and horizontal lines show the wiring tracks. The pin 1801 has a rectangular cross sectional shape.

In the optimal case illustrated in FIG. 26A, the number of grids may be set to 12. In the non-optimal case illustrated in FIG. 26B, the number of grids may be set to 7. The number of empty wiring tracks in each of the H and V directions may be set to 2 in the optimal case illustrated in FIG. 26A. The number of empty wiring tracks in each of the H and V directions may be set to 1 in the non-optimal case illustrated in FIG. 26B. In this way, the wiring resource may be changed by the positional relationship between the pins 1801 and the wiring track. Thus, in an exemplary embodiment, the wiring resource is maximized by adjusting the positional relationship with reference to the gap between the pins (obstacles) 1801, the pin size, and the wiring rule.

FIGS. 27A-27B illustrate a calculation method of a maximum number of wirings which can be made to pass between obstacles. Pins 2001 are assumed as obstacles.

It may be assumed that the interval between the adjacent pins 2001 is D, that the radius of the pin 2001 is r, that the gap (clearance) between the pin 2001 and the wiring is Cp, that the wiring width is 2 w, and that the gap (clearance) between the wirings is Cl. As a result, the distance L left to be used for wiring between the pins 2001 may be calculated as follows:

$$L=D-2(r+Cp)$$

If the relationship of L≥2 w is established, at least one wiring can be arranged. If the relationship of (L−2 w)/(2 w+C1)≥1 is established, two or more wirings can be arranged. From this, the maximum number t of wirings which can be arranged can be calculated as follows:

$$t=1+\text{floor}((L-2w)/(2w+Cl)).$$

In the formula, "floor" represents an operator which calculates an integer maximum value from the numerical value in the parenthesis.

Where It may be assumed that the pin array of a component (such as a BGA) is h×v, the number of empty wiring tracks estimated in the region in which the component is arranged can be obtained as follows, by setting the number of empty wiring tracks in the H direction as Th, and setting the number of empty wiring tracks in the V direction as Tv:

$$Th=t(h-1)$$

$$Tv=t(v-1)$$

The number of empty grids G can be obtained as follows:

$$G=(Th+h)(Tv+v)-hv.$$

Figure 28:
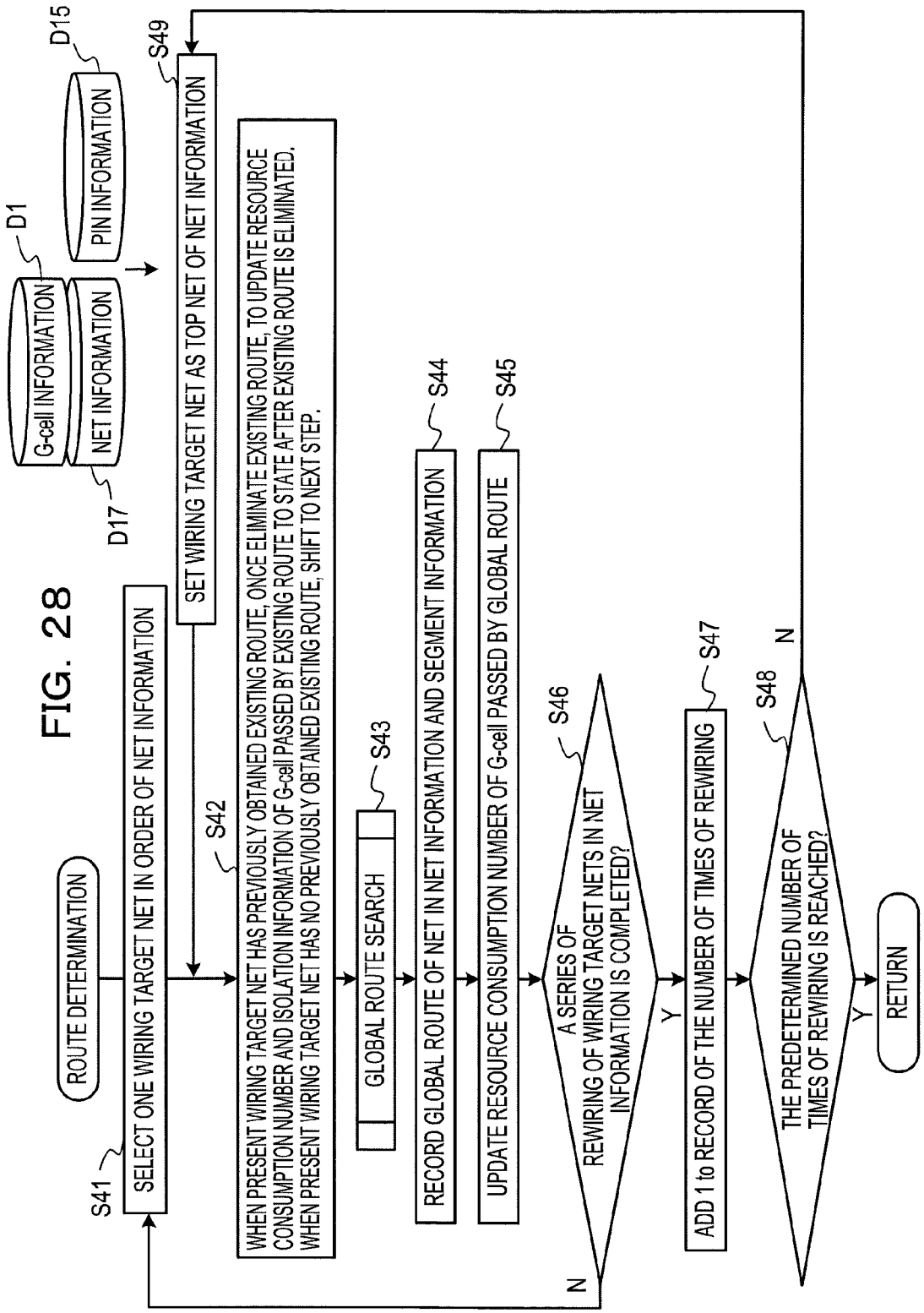
FIG. 28 illustrates route determination processing.

FIG. 28 illustrates route determination processing which is performed by the route determination section 15 to determine the route of one wiring.

In the determination of the wiring route for each of the G-cells 1203, the wiring route is successively determined. For this reason, the other wiring routes are not taken into consideration from the beginning. The wiring route determination is repeatedly performed while reflecting the previously performed determination in the next determination. Thereby, a suitable wiring route is eventually determined.

In operation S41, the route determination section 15 selects one wiring (net) to be arranged, according to the order registered in the net information D19. In operation S42, when the wiring to be arranged at present has a previously determined result (existing route), the route determination section 15 once eliminates the previously determined result. In correspondence with the elimination of the previously determined result, the route determination section 15 updates the number of consumed resource grids in the G-cell information D1 of the G-cell 1203 included in the existing route, and the discrete information of the pin connected by the existing route in the pin information D15. Then, the route determination section 15 shifts to operation S43. When there is no such existing route, the route determination section 15 shifts to operation S43 without performing such update processing.

In operation S43, the route determination section 15 performs global route search processing which searches a wiring route to be set as a substitute for the eliminated existing route. In operation S44, the route determination section 15 stores the result obtained by the search processing in the net information D19 and the line segment information D20. In operation S45, the route determination section 15 updates the number of consumed resource grids in the G-cell information D1 of the G-cell 1203 included in the wiring route which is the search result.

In operation S46, the route determination section 15 determines whether or not a series of the wiring routes registered in the net information D19 may be determined. When the other wiring whose route is to be determined is left, the route determination section 15 determines as NO and returns to operation S41 as described above. Next, the route determination section 15 selects one target wiring. When no wiring whose route is to be determined is left, the route determination section 15 determines as YES and shifts to operation S47.

In operation S47, the route determination section 15 increments the record of the number of times of rewiring processing, which is the number of times at which a series of the wiring routes may be determined. In operation S48, the route determination section 15 determines whether or not the number of times of rewiring processing after the record of the number of times of rewiring processing is incremented, has reached a predetermined value. When the number of times of rewiring coincides with the predetermined value, the route determination section 15 determines as YES and ends here the route determination processing. When the number of times of rewiring processing is less than the predetermined value, the route determination section 15 determines as NO, and registers a wiring to be next targeted at the top of the net information D19 in operation S49, so as to shift to operation S42 as described above.

Figure 29:
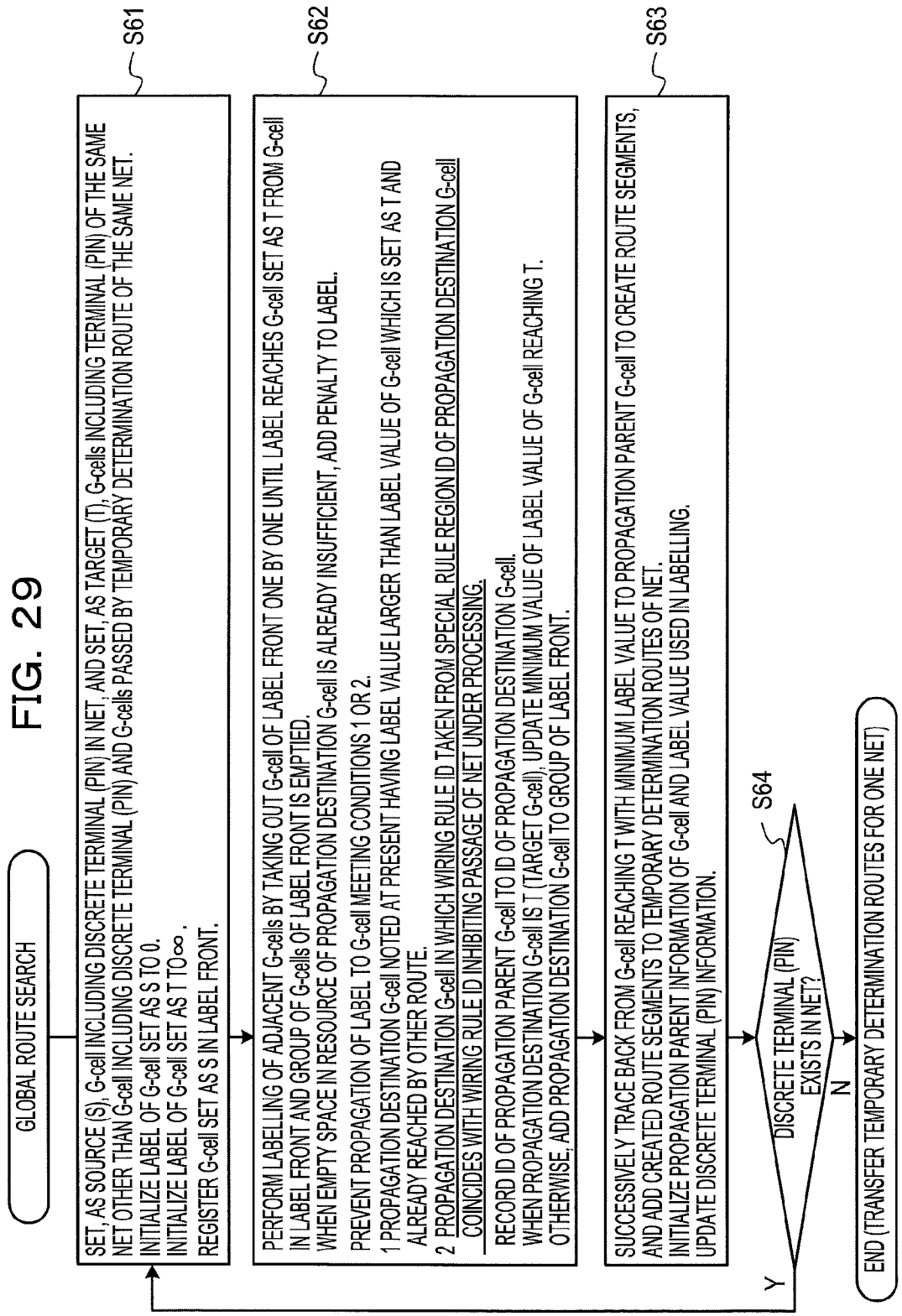
FIG. 29 illustrates global route search processing.

FIG. 29 illustrates global route search processing performed by the route determination section 15. The global route search processing determines the wiring route selected in operation S41 in FIG. 27 by searching.

In operation S61, the route determination section 15 sets, as a source (S), the G-cell 1203 in which one of the pins connected to the wiring selected in operation S41 as described above is arranged, and sets, as targets (T), the G-cells 1203 in which the other pins connected to the wiring selected in operation S41 are arranged, and the G-cells 1203 which are passed by temporarily determined wiring routes (denoted by "the same net temporary determination routes") reaching the G-cells 1203 in which the other pins connected to the wiring selected in operation S41 are arranged. The route determination section 15 sets the G-cell 1203 set as S to have a label value of 0 as the initial value, and sets the G-cells 1203 set as T to have a label value of a settable maximum value (denoted by "∞" in the figure) as the initial value. The route determination section 15 registers the ID of the G-cell 1203 set as S in the label front which is a work area secured, for example, on a semiconductor memory. Here, in order that the G-cell 1203 in which the pin connected to the wiring is arranged, is distinguished from the G-cell 1203 passed by the wiring route, T of the G-cell 1203 in which the pin connected to the wiring is arranged is described as "final T". The route determination section 15 performs the setting of S or T and the setting of the label value with respect to the G-cell information D1.

In operation S62, the route determination section 15 searches, for each of G-cells 1203 which are set as S and which are registered in the label front, a route to reach the G-cell 1203 set as final T, by propagating the G-cell 1203 one by one from the G-cell 1203 set as S.

In the search processing, the route determination section 15 sets the label of the propagation parent G-cell 1203 as the label of the propagation destination G-cell 1203, that is, updates the label value of the propagation destination G-cell 1203 as required. The update of the label value is performed by the following reasons.

A plurality of routes may exist from the G-cell 1203 set as S to the G-cell 1203 set as T. The search processing is performed for all conceivable wiring routes by propagating the G-cell 1203 one by one from the G-cell 1203 set as S to the G-cell 1203 set as T. The labeling is performed in such a manner that a value obtained by adding a predetermined value to the label value of the propagation parent G-cell 1203 may be set as the label value of the propagation destination G-cell 1203. For this reason, a label value other than the maximum value is already set in the propagation destination G-cell 1203 which has been propagated. A larger label value indicates a longer wiring route. A shorter wiring route may be desirable. Thus, when the already updated label value of the propagation destination G-cell 1203 is smaller than the value to be set by the labeling, a shorter route is searched as the route to the propagation destination G-cell 1203. It is not necessary to search a longer route. For this reason, the label value of the propagation destination G-cell 1203 is updated as required. Therefore, it may be configured such that each search processing is ended at the time when the search processing is found to be unnecessary. As a result, a minimum value is stored as the label value of the G-cell information D1, and the ID of the G-cell 1203, for which the minimum label value is obtained, is stored as the ID of the propagation parent G-cell.

There is a case where a necessary wiring resource is not left in the propagation destination G-cell 1203. In this case, the labeling is performed by adding a predetermined value (penalty value), so as to prevent the extraction of the wiring route passing through the propagation destination G-cell 1203 in which the necessary wiring resource is not left.

Further, a non-allowable wiring rule for preventing a wiring from passing through a G-cell is stored in the net information D19 as required. For this reason, the propagation is performed in such a manner that the G-cell 1203 which is to be prevented from being passed by the target wiring is excluded based on the wiring rule. Thereby, the determination of the wiring route as illustrated in FIGS. 12A AND 12B is realized.

Where the propagation destination G-cell 1203 is the G-cell 1203 set as final T, when the label value of the G-cell 1203 set as final T is already updated, the already updated label value is compared with the label value set by the labeling at this time. On the condition that the label value set by the labeling at this time is smaller the already updated label value, the label value is updated by storing the label value set by the labeling at this time. When the label value of the G-cell 1203 set as final T is not updated, the label value set by the labeling at this time is stored, and the label of the G-cell 1203 set as final T is registered in the label front.

In operation S62, the route determination section 15 performs the above described processing. For each of the G-cells 1203 set as final T, the route determination section 15 extracts a route having a minimum label value from routes from the G-cell 1203 set as S to the G-cell 1203 set as final T.

In operation S63, for each of the G-cells 1203 set as final T, the route determination section 15 successively traces back from the G-cell 1203 set as final T to the propagation parent G-cell 1203, so as to create route segments along which the traced route reaches the propagation parent G-cell 1203 with the minimum label value. The route determination section 15 adds the route segments in the global route information D40 as a temporary determination route (global route). The route determination section 15 initializes the propagation parent information and the label value, which is used by the search processing, based on the labeling, and updates, to 0, the discrete information of the pin in the pin information D15, to which pin the temporary determination route is created. Here, the propagation parent information and the label value mean a group of IDs of G-cells 1203 which are included and passed by each of the searched routes, and the label values of the respective G-cells 1203. The temporary determination route added to (registered in) the global route information D40 is a combination (including the order) of IDs of the G-cells 1203 obtained by the back trace. In addition to the temporary determination route, the IDs of the pins, and the like, connected by the temporary determination route are also registered in the global route information D40.

In operation S64, the route determination section 15 determines whether or not a pin, for which a temporary determination route is not created, exists among the pins to be connected by the wiring selected in operation S41 in FIG. 25. When a G-cell 1203, for which a temporary determination route is not created, exists among the G-cells 1203 set as S or the G-cells 1203 set as T, which are registered in the label front, the route determination section 15 determines as YES, and returns to operation S61, so as to perform initial setting for searching a temporary determination route to be determined. When there exists no G-cell 1203 for which a temporary determination route is not created, the route determination section 15 determines as NO, and ends here the global route search processing.

In an exemplary embodiment, all the G-cells including secondary G-cells are set to have a rectangular shape so as to make it easily specify the correspondence relationship between the G-cells adjacent to each other, but all the G-cells may be set to have a shape other than the rectangle. For this reason, the generation method itself of the region to which a single wiring rule is applied is not limited in particular. Further, the automatic wiring apparatus is described as a dedicated apparatus, but may also be realized by being mounted to an automatic layout apparatus, or the like, which performs automatic layout processing.

In an exemplary embodiment, first division regions and further second division regions are generated, so that a single wiring rule is applied to each of the first and second division regions which are eventually left. Thereby, it is possible to avoid that due to the mixedly existing wiring rules, an unsuitable wiring resource may be estimated and an unsuitable wiring may be performed.

Further, first division regions and further second division regions are generated, so that a single wiring rule is applied to each of the first and second division regions which are eventually left. Thereby, it is possible to avoid that due to the mixedly existing wiring rules, an unsuitable wiring resource is estimated and an unsuitable wiring is performed. As a result, it is possible to avoid that the designer's work is made complicated, and it is also possible to suppress that the calculation time required for the automatic wiring is elongated.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A non-transitory computer readable medium encoded with a computer program for wiring design, the program when executed by a computer causes the computer to perform a method comprising:
   dividing a wiring region to create a first g-cell represented by wiring region data based on a first wiring rule, the first g-cell including a plurality of horizontal and vertical lines that intersect at a plurality of grid points;
   when the first g-cell includes a subregion to which a second wiring rule different from the first wiring rule is applied, extracting vertexes of the subregion;
   dividing the first g-cell including the subregion into a plurality of second g-cells by generating vertical and horizontal lines passing through the vertexes; and
   merging a pair of second g-cells among the plurality of second g-cells to generate a plurality of third g-cells, the pair of second g-cells being adjacent to each other and which satisfy a condition that a same wiring rule, among the first wiring rule and the second wiring rule, is applied.

2. The non-transitory computer readable medium according to claim 1, further comprising:
   calculating a wiring resource indicating an amount of wirings that can be accommodated in the first g-cell and the plurality of third g-cells, based on a wiring width and a minimally required interval with a wiring, which are indicated by the respective first or second wiring rule.

3. The non-transitory computer readable medium according to claim 2, wherein the interval indicated by the respective wiring rule includes a first interval which is minimally required between the wirings and a second interval which is minimally required between a conductive section conductive with a semiconductor component and the wiring, and
   wherein based on the wiring width, the first interval, the second interval, and the distance between the conductive sections, which are indicated by the respective wiring rule, the calculating includes calculating a maximum wiring resource in a region that includes the plurality of conductive sections conductive with the semiconductor component in the first g-cell and the plurality of third g-cells.

4. The non-transitory computer readable medium according to claim 1, wherein when there is generated a wiring route connecting a source division region to a target division region, which regions exist in the first g-cell and the plurality of third g-cells, the wiring route is generated based on a wiring rule which is not to be applied to the wiring, and based on the first and second wiring rules that are applied to the first g-cell and the plurality of third g-cells.

5. The non-transitory computer readable medium according to claim 1, wherein the extracting includes excluding the vertexes whose coordinates coincide with coordinates of vertexes of the first g-cell from objects to be extracted.

6. The non-transitory computer readable medium according to claim 1, wherein the merging includes:
   merging the second g-cells which are adjacent to each other in the horizontal direction and which satisfy a condition that the same wiring rule is applied, and
   merging the second g-cells which are adjacent to each other in the vertical direction and which satisfy the condition that the same wiring rule is applied.

7. The non-transitory computer readable medium according to claim 1, further comprising setting an identifier to each of the second g-cells, and the merging includes merging the pair of second g-cells based on the identifier.

8. The non-transitory computer readable medium according to claim 7, wherein the merging includes merging the pair of second g-cells when the identifier of the pair of second g-cells is the same.

9. A wiring design apparatus comprising:
   a processor configured to:
   divide a wiring region to create a first g-cell represented by wiring region data based on a first wiring rule, the first g-cell including a plurality of horizontal and vertical lines that intersect at a plurality of grid points,
   when the first g-cell includes a subregion to which a second wiring rule different from the first wiring rule is applied, extract vertexes of the subregion,
   divide the first g-cell including the sub region into a plurality of second g-cells by generating vertical and horizontal lines passing through the vertexes to generate, and
   merge a pair of second g-cells among the plurality of second g-cells to generate a plurality of third g-cells, the pair of second g-cells being adjacent to each other and which satisfy a condition that a same wiring rule, among the first wiring rule and the second wiring rule, is applied.

10. A wiring design method, comprising:
    dividing a wiring region to create a first g-cell represented by wiring region data based on a first wiring rule, the first g-cell including a plurality of horizontal and vertical lines that intersect at a plurality of grid points;
    when the first g-cell includes a subregion to which a second wiring rule different from the first wiring rule is applied, extracting vertexes of the sub region;
    dividing the first g-cell including the subregion into a plurality of second g-cells by generating vertical and horizontal lines passing through the vertexes; and
    merging a pair of second g-cells among the plurality of second g-cells to generate a plurality of third g-cells, the pair of second g-cells being adjacent to each other and which satisfy a condition that a same wiring rule, among the first wiring rule and the second wiring rule, is applied,
    wherein the dividing of the wiring region, the extracting, the dividing of the first g-cell, and the merging are performed by a processor.

11. The wiring design method according to claim 10, further comprising:
    calculating a wiring resource indicating an amount of wirings that can be accommodated in the first g-cell and the plurality of third g-cells, based on a wiring width and a minimally required interval with a wiring, which are indicated by the respective first or second wiring rule.

12. The wiring design method according to claim 10, wherein the interval indicated by the respective wiring rule includes a first interval which is minimally required between the wirings and a second interval which is minimally required between a conductive section conductive with a semiconductor component and the wiring, and wherein based on the wiring width, the first interval, the second interval, and the distance between the conductive sections, which are indicated by the respective wiring rule, the calculation includes calculating a maximum wiring resource in a region that includes the plurality of conductive sections conductive with the semiconductor component in the first g-cell and the plurality of third g-cells.

13. The wiring design method according to claim 10, wherein when there is generated a wiring route connecting a source division region to a target division region, which regions exist in the first g-cell and the plurality of third g-cells, the wiring route is generated based on a wiring rule which is not to be applied to the wiring, and based on the first and second wiring rules that are applied to the first g-cell and the plurality of third g-cells.

14. The wiring design method according to claim 10, wherein the extracting includes excluding the vertexes whose coordinates coincide with coordinates of vertexes of the first g-cell from objects to be extracted.

15. The wiring design method according to claim 10, wherein the merging includes:

merging the second g-cells which are adjacent to each other in the horizontal direction and which satisfy a condition that the same wiring rule is applied, and merging the second g-cells which are adjacent to each other in the vertical direction and which satisfy the condition that the same wiring rule is applied.

16. The wiring design method according to claim 10, further comprising setting an identifier to each of the second g-cells, and the merging includes merging the pair of second g-cells based on the identifier.

17. The wiring design method according to claim 10, wherein the merging includes merging the pair of second g-cells when the identifier of the pair of second g-cells is the same.

* * * * *